(12) United States Patent
Bruce et al.

(10) Patent No.: US 10,707,417 B1
(45) Date of Patent: Jul. 7, 2020

(54) SINGLE-SIDED LINER PCM CELL FOR 3D CROSSBAR PCM MEMORY

(71) Applicant: International Business Machines Corporation, Armonk, NY (US)

(72) Inventors: Robert L. Bruce, White Plains, NY (US); Matthew Joseph BrightSky, Armonk, NY (US); SangBum Kim, Suwanee, GA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/401,706

(22) Filed: May 2, 2019

(51) Int. Cl.
*H01L 45/00* (2006.01)
*H01L 27/24* (2006.01)

(52) U.S. Cl.
CPC ...... *H01L 45/1691* (2013.01); *H01L 27/2481* (2013.01); *H01L 45/1233* (2013.01); *H01L 45/1683* (2013.01); *H01L 27/2409* (2013.01); *H01L 27/2427* (2013.01); *H01L 45/06* (2013.01); *H01L 45/144* (2013.01)

(58) Field of Classification Search
CPC ............. H01L 45/1691; H01L 45/1233; H01L 45/1683; H01L 27/2481; H01L 27/2409; H01L 27/2427
See application file for complete search history.

(56) References Cited

U.S. PATENT DOCUMENTS

| 6,914,801 | B2 | 7/2005 | Kostylev et al. |
| 7,701,749 | B2 | 4/2010 | Jeong et al. |
| 7,936,593 | B2 | 5/2011 | Savransky |
| 9,537,093 | B1* | 1/2017 | Lai .......................... H01L 45/06 |
| 9,627,612 | B2 | 4/2017 | Brightsky et al. |
| 10,056,546 | B2 | 8/2018 | Brightsky et al. |
| 2017/0331036 | A1 | 11/2017 | Collins et al. |

(Continued)

OTHER PUBLICATIONS

Kim et al., "A Phase Change Memory Cell With Metal Nitride Liner as a Resistance Stabilizer to Reduce Read Current Noise for MLC Optimization," IEEE Transactions on Electron Devices, vol. 63, No. 10, Oct. 2016, pp. 3922-3927.

(Continued)

*Primary Examiner* — Matthew L Reames
(74) *Attorney, Agent, or Firm* — Scully, Scott, Murphy & Presser, P.C.; L. Jeffrey Kelly, Esq.

(57) ABSTRACT

A cross-point memory array and method for manufacturing. The memory array includes a plurality of first conductive line structures formed in a dielectric material layer; a plurality of memory elements, each memory element including a fill-in phase change memory (PCM) cell, and an access device enabling read or write access to said memory PCM structure; a plurality of second conductive line structures, the plurality of second conductive structures perpendicularly oriented relative to the plurality of first conductive structures. An individual memory element of the plurality of memory elements is conductively connected at a respective intersection between a first conductive line structure and a second conductive line structure. Each phase change memory (PCM) cell of a memory element at an intersection having a sub-lithographic conductive tuning liner disposed on only one sidewall of the PCM cell. The manufacturing maintains a minimal number of masking and processing steps.

11 Claims, 27 Drawing Sheets

(56) References Cited

U.S. PATENT DOCUMENTS

2018/0205017 A1 7/2018 Bruce et al.
2019/0103467 A1* 4/2019 Takaki .............. H01L 29/41741

OTHER PUBLICATIONS

Kau et al., "A stackable cross point phase change memory", International Electron Devices Meeting (IEDM), 2009, paper 27.1, Jan. 2010, 4 pages.
Breitwisch, "Phase Change Memory", 2008 IEEE International Interconnect Technology Conference , Proceedings of a meeting held Jun. 1-4, 2008, Burlingame, California, pp. 219-221.

* cited by examiner

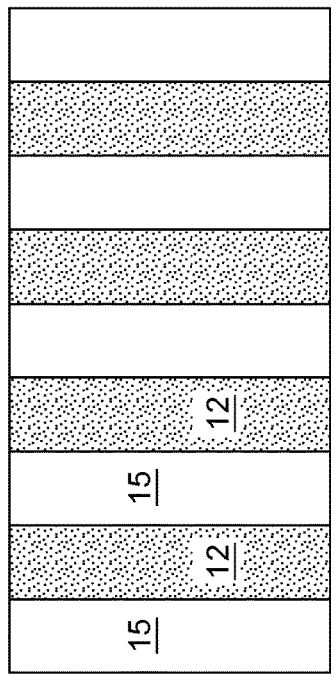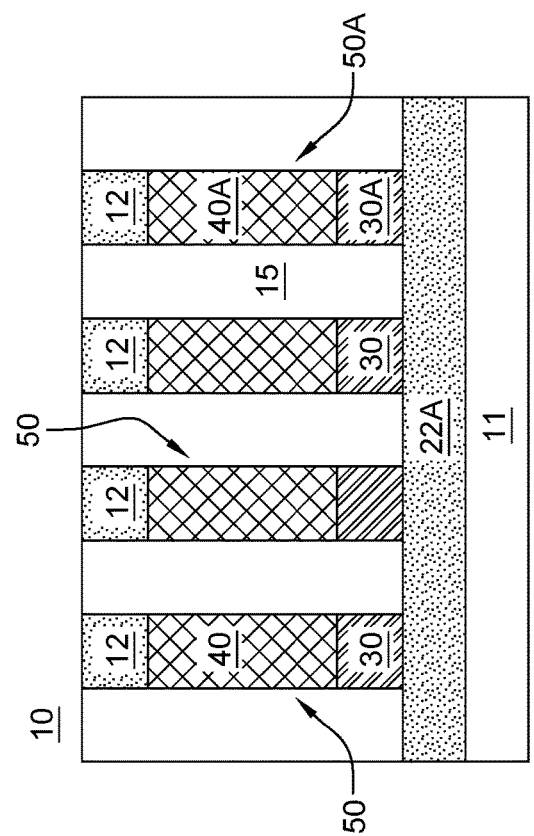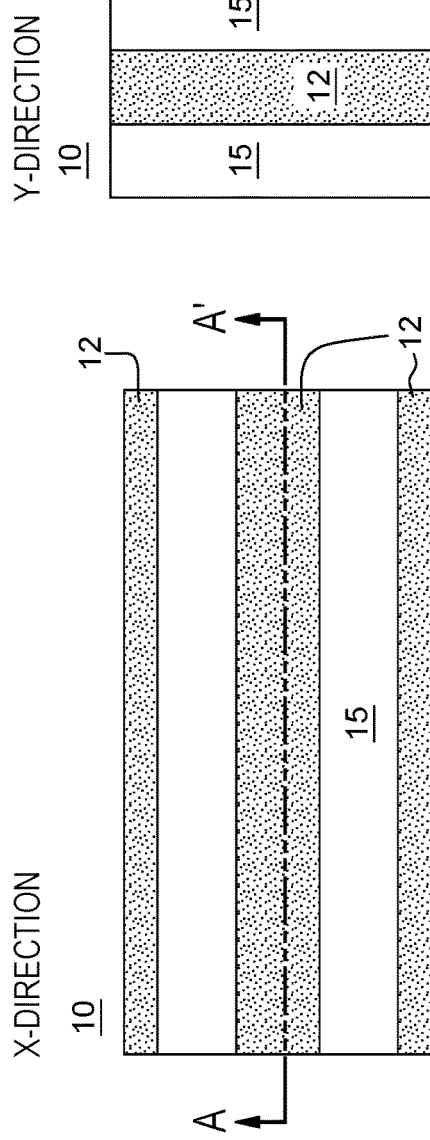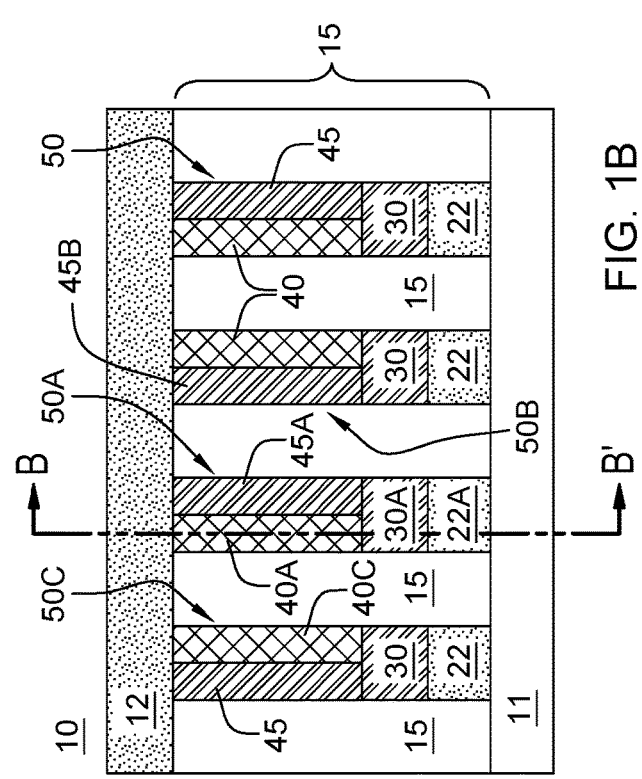

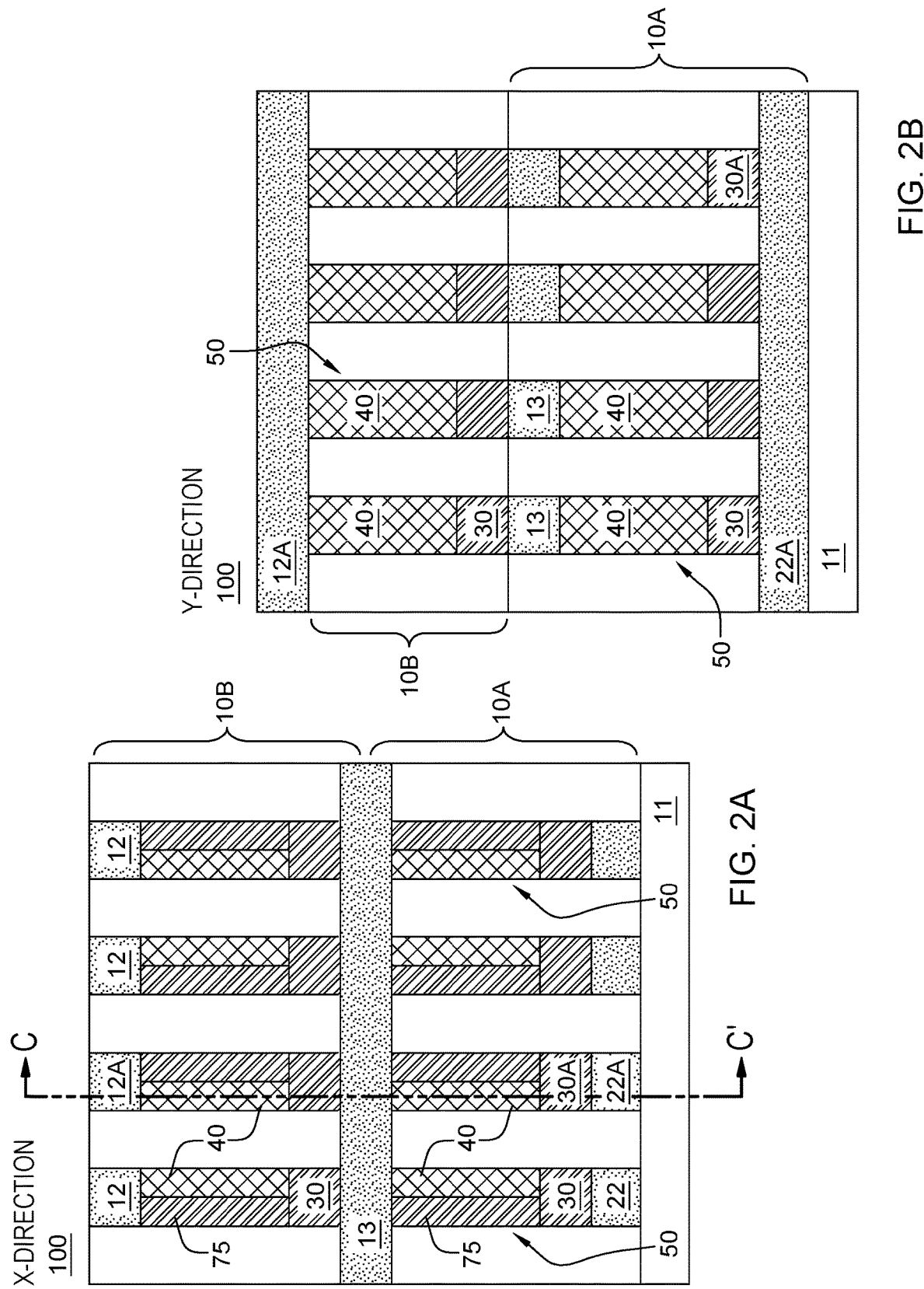

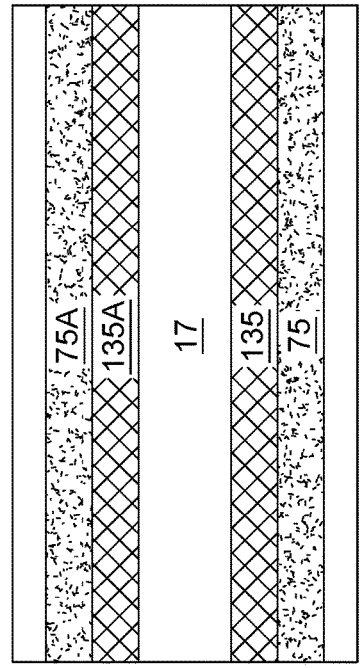
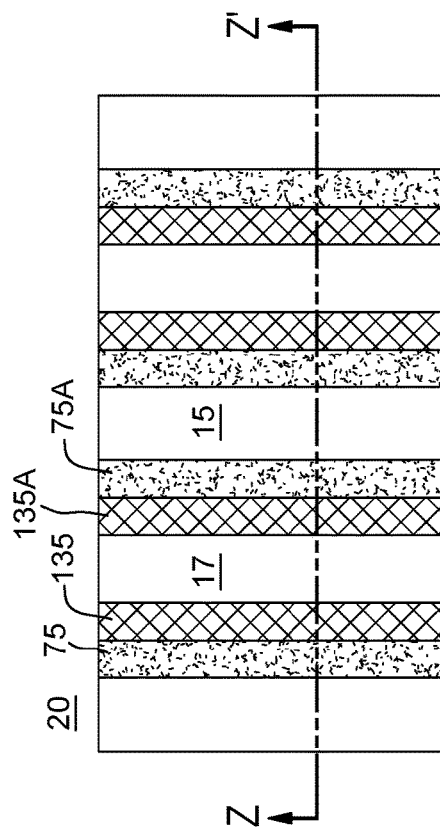
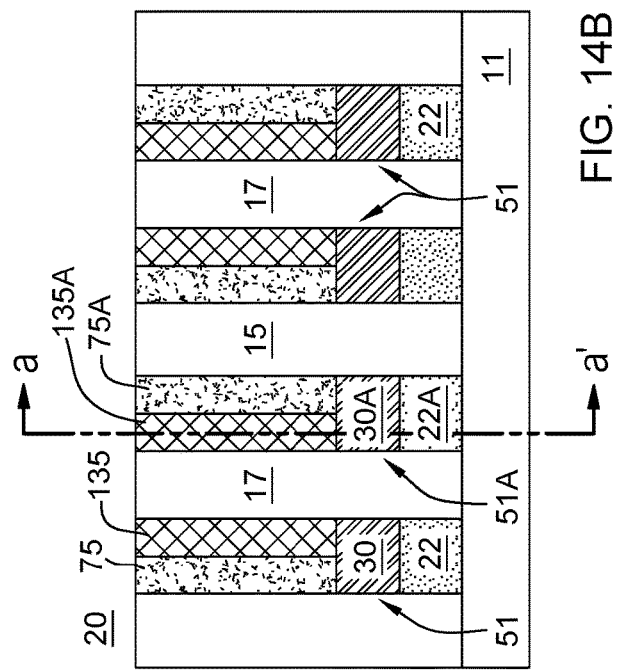
FIG. 14A  FIG. 14B  FIG. 14C  FIG. 14D

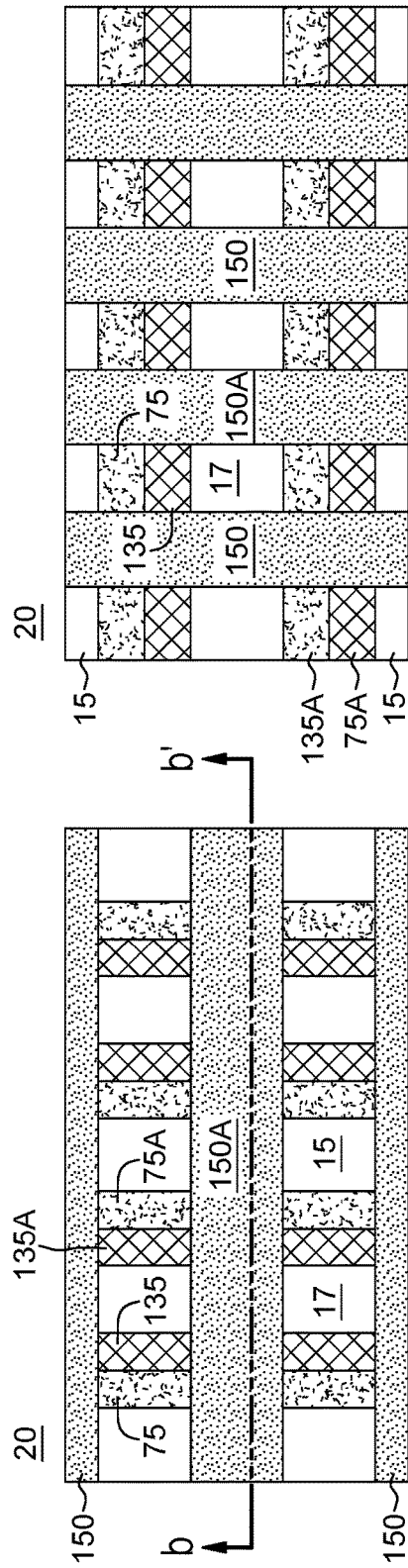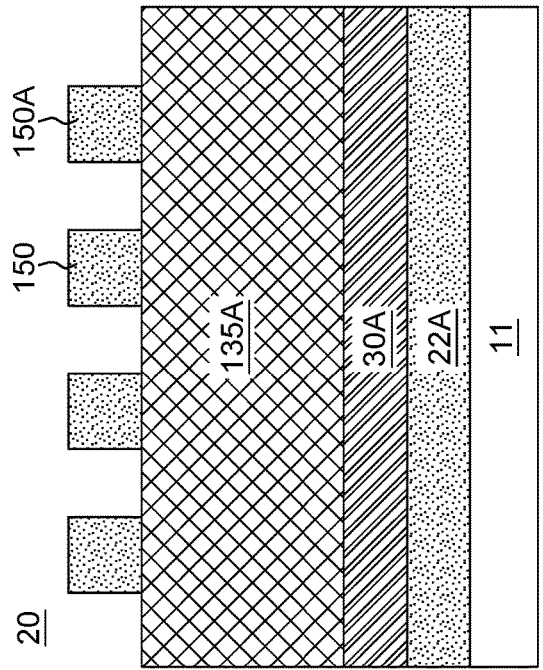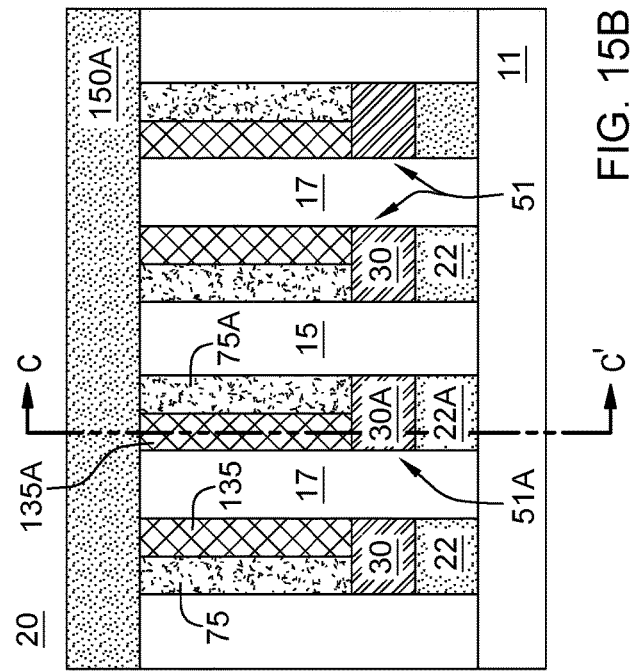

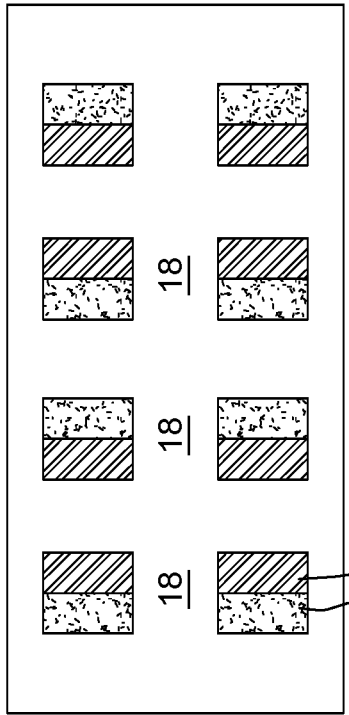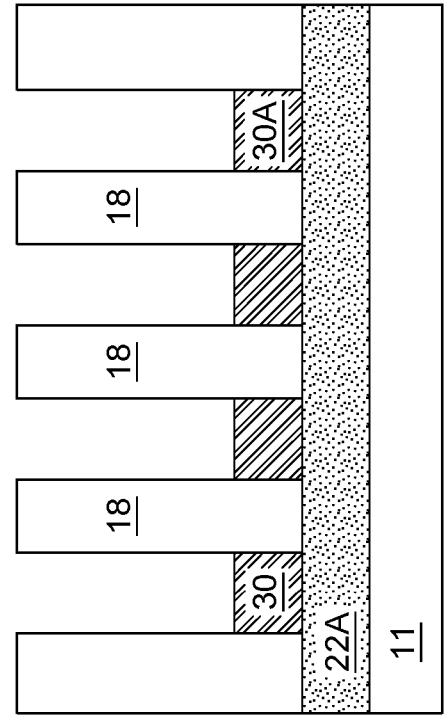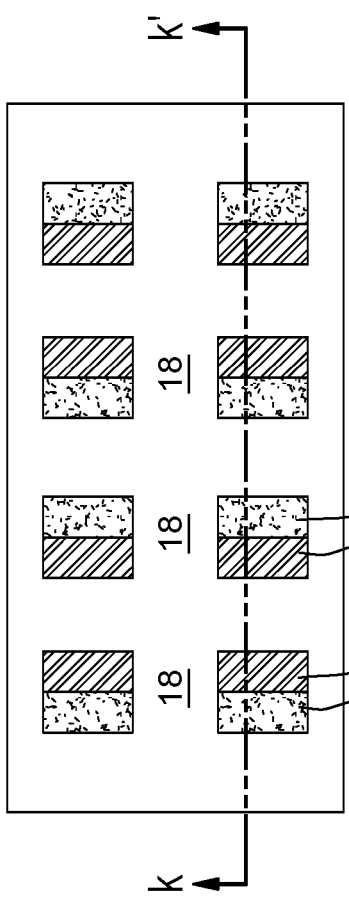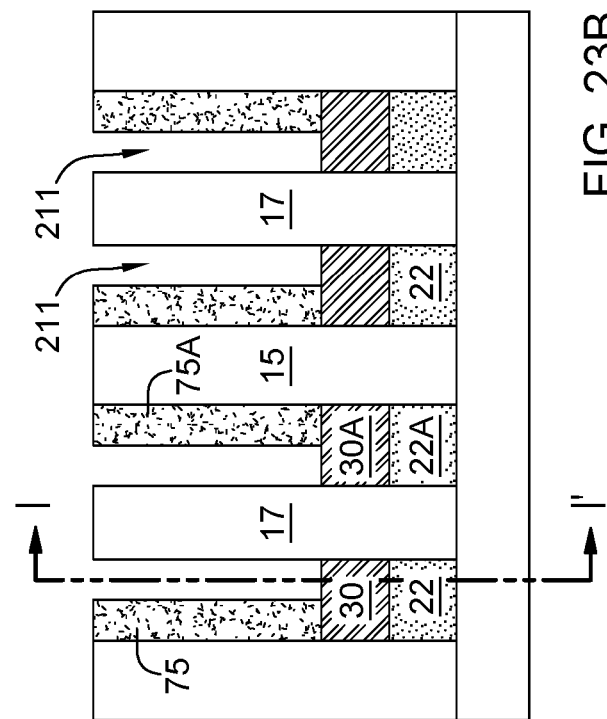

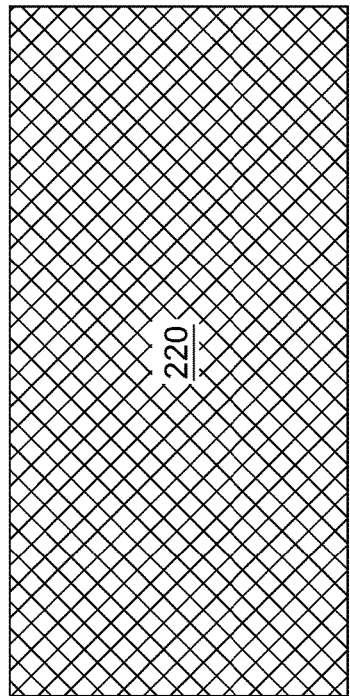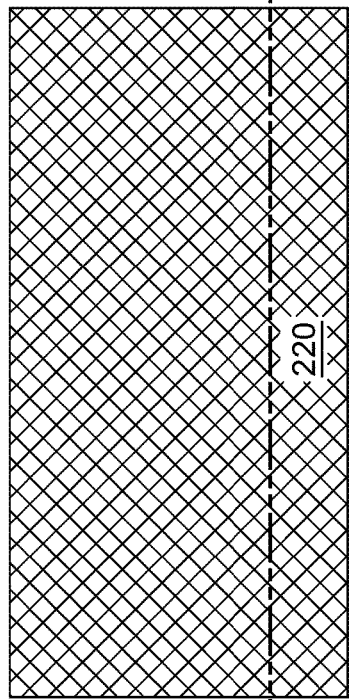

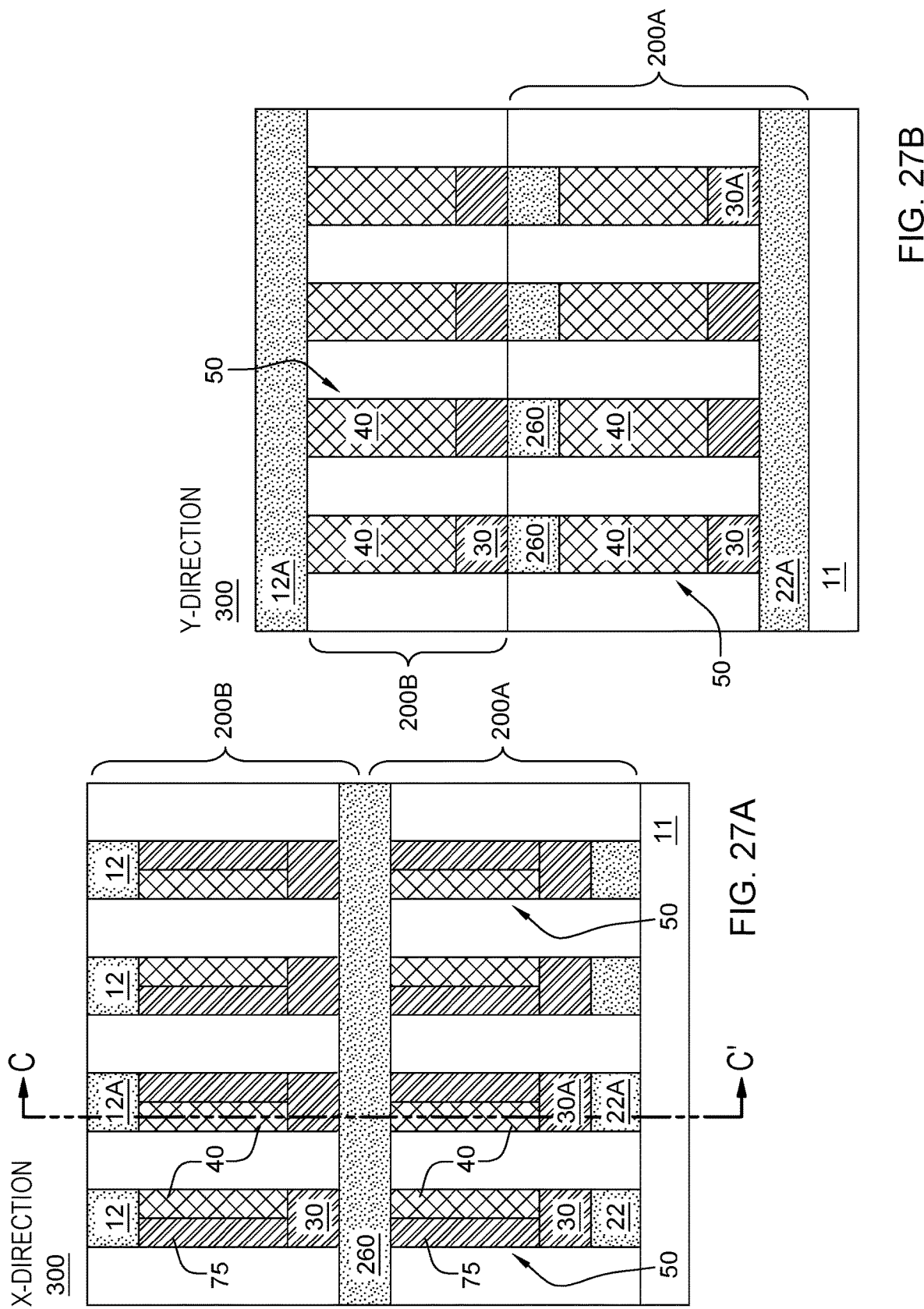

SINGLE-SIDED LINER PCM CELL FOR 3D CROSSBAR PCM MEMORY

FIELD

The present application relates to memory arrays, and, in particular, crosspoint memory structures and methods for fabricating such crosspoint memory array structures that maintain a minimal number of masking and processing steps.

BACKGROUND

The maximal ideal density of a 2-dimensional memory array is achieved with a 4F2 crosspoint array (where F is the minimum resolvable feature size) where at each of the intersections of perpendicular wiring lines is the memory cell. In order to form a crosspoint memory array for resistive memory (examples: phase change memory (PCM) or RRAM) the memory element is comprised of a memory cell and an access device. It is advantageous to fabricate the memory array with a minimal number of masking steps and processing steps, however, an adequate number of processing steps of certain types is required for forming a reliable memory cell. A single patterning using Reactive Ion Etching (RIE) of the memory element and the access device would minimize the number of masking layers and processing steps, however, there are cases in which it is impossible to pattern the memory element using RIE without also damaging or modifying the memory element during the RIE.

Resistance drift of the amorphous region of the phase change material is a reliability concern, especially for MLC PCM. One method to mitigate this resistance drift is to include an Rs tuned liner in the PCM cell so that the read current path utilizes this liner and bypasses the amorphous region of the phase change material. The drawback of combining these two features is that the lowest achievable resistance is increased by the liner and the resistance of the thin film liner is difficult to control due to the highly non-linear resistivity vs. thickness.

SUMMARY

In one aspect there is provided a Phase Change Memory element (PCM cell) having a single-sided conductive liner.

There is further provided a method of manufacturing a crosspoint PCM cell memory architecture having PCM cells connected at intersections of wordlines and bitlines, with each Phase Change Memory cell manufactured to have a single-side conductive liner.

A storage class memory for storing a large amount of data in compact Phase Change Memory elements (PCM cells) in a high density highly compact crosspoint memory array where each PCM cell of the array has a single-sided conductive liner.

A crosspoint memory structure and method that requires a minimal number of masking and processing steps and incorporates a combination of a fill-in PCM memory element with Rs tuned liner on one side and with a respective etched (using RIE) access device.

In one embodiment, the Phase Change Memory cell is fabricated with minimal exposure of the phase change material to RIE chemistry using a fill-in process flow within the sacrificial masking layer of the etched access device. The wiring levels can be self-aligned to the access device and memory cell; the lower wiring level (e.g., a Word Line) is patterned in conjunction with the patterning of the access device and the upper wiring level (e.g., a Bit Line) is either patterned in conjunction with the patterning of the top electrode of the PCM cell or patterned together with the top electrode, Phase Change Memory and access device.

In an embodiment, multiple layers of this crosspoint memory array structure can be combined to form a 3-dimensional PCM crosspoint memory architecture.

In accordance with a first aspect of the invention, there is provided a semiconductor memory array structure. The semiconductor memory array structure comprises: a plurality of first conductive line structures formed in a dielectric material layer; a plurality of memory elements formed in a dielectric material layer, each memory element including a phase change memory (PCM) cell having at least one sidewall, and an access device enabling read or write access to the memory PCM structure; a plurality of second conductive line structures, the plurality of second conductive structures perpendicularly oriented relative to the plurality of first conductive structures to form a two-dimensional crosspoint array, wherein an individual memory element of the plurality of memory elements is conductively connected at a respective intersection between a first conductive line structure and a second conductive line structure to form the crosspoint memory array, each phase change memory (PCM) cell of the memory element at an intersection having a sub-lithographic conductive tuning liner vertically disposed on only one sidewall of the PCM cell.

In accordance with a further aspect of the invention, there is provided a method of forming a memory array. The method comprises: forming a plurality of trench structures within a first dielectric layer, each trench of the plurality having a first conductive material layer on a bottom surface and an access device material layer formed on the first conductive material layer, a first layer of tuning liner material formed on inner sidewall surfaces in the trench, and a second sacrificial liner material formed on sidewalls adjacent to the first layer of turning liner material, each trench separated by adjacent first dielectric material structures; patterning and etching an opening within each trench of the plurality, the etching selective to an underlying dielectric material below the first dielectric layer; and each opening defining a pattern comprising a plurality of structures, each structure defining a first conductive line structure, an access device layer above the first conductive material line structure and a liner structure disposed vertically above the access layer comprising adjacent layers of the tuning liner material and sacrificial liner material, the first conductive material line layer, the access layer, and vertically disposed liner structure in sidewall alignment; depositing in the openings within each trench a dielectric material and planarizing a surface to render surfaces of the vertically disposed liner structure and the deposited dielectric material coplanar; removing the adjacent sacrificial liner material from each vertically disposed liner structure in the pattern to provide an opening in the vertically disposed liner structure, the opening exposing a top surface of the access device layer; and depositing a PCM material into the openings in each vertically disposed liner structure adjacent the tuning liner material to form a memory element having the tuning liner material disposed only on a single side of the PCM material, and planarizing a surface to render coplanar surfaces of the memory element and the deposited dielectric material; patterning and forming a plurality of second conductive line structures on the surface in an orientation perpendicular relative to the first conductive material line structures; and performing perpendicular cut etching to remove all dielectric material between the structures, the perpendicular cut etch rendering a 2-Dimensional cross point memory array having self-aligned bitlines and wordlines with respect to the memory elements, and depositing a dielectric fill material in openings removed by the perpendicular cut etching and planarizing a surface to render top surfaces of the dielectric fill material and the first conductive material line structures coplanar.

In accordance with yet a further aspect of the invention, there is provided a method of forming a memory array. The method comprises: forming on a plurality of trench structures within a first dielectric layer, each trench of the plurality having a first conductive material layer on a bottom surface and an access device material layer formed on the first conductive material layer, a first layer of tuning liner material formed on inner sidewall surfaces in the trench, and a second sacrificial liner material formed on sidewalls adjacent to the first layer of turning liner material, each trench separated by adjacent first dielectric material structures; patterning and etching an opening within each trench of the plurality, the etching selective to an underlying dielectric material below the first dielectric layer; and each opening defining a pattern comprising a plurality of structures, each structure defining a first conductive line structure, an access device layer above the first conductive material line structure and a liner structure disposed vertically above the access layer comprising adjacent layers of the tuning liner material and sacrificial liner material, the first conductive material line layer, the access layer, and vertically disposed liner structure in sidewall alignment; depositing in the openings within each trench a dielectric material and planarizing a surface to render surfaces of the vertically disposed liner structure and the deposited dielectric material coplanar; patterning a mask structure to form a pattern of sacrificial line structures on the planarized surface, the patterned sacrificial line structures oriented in a direction perpendicular to the plurality of first conductive line structures; performing perpendicular cut etching to remove all dielectric material between the structures selective to the underlying first conductive material line structure; depositing a dielectric fill material in openings removed by the perpendicular cut etching and planarizing a surface to render top surfaces of the dielectric fill material and the mask line structures coplanar; performing CMP to expose a top surface of the vertically disposed adjacent layers of the tuning liner material and sacrificial liner material of each liner structure; removing the adjacent sacrificial liner material from each vertically disposed liner structure in the pattern to provide an opening in the vertically disposed liner structure, the opening exposing a top surface of the access device layer; and depositing a PCM material into the openings in each vertically disposed liner structure adjacent the tuning liner material to form a memory element having the tuning liner material disposed only on a single side of the PCM material, and planarizing a surface to render coplanar surfaces of the PCM material and the dielectric material; and patterning and forming a plurality of second conductive line structures on the surface in an orientation perpendicular relative to the first conductive material line structures, the second conductive line structures contacting exposed surfaces of the memory element of adjacent elements along the first conductive line structures, the patterning and forming of the second conductive line structures rendering a 2-Dimensional cross point memory array.

BRIEF DESCRIPTION OF THE DRAWINGS

These and other objects, features and advantages of the present invention will become apparent from the following detailed description of illustrative embodiments thereof, which is to be read in connection with the accompanying drawings, in which:

FIG. 1A depicts a top down view of an upper level of a stackable single layer 2-D crosspoint array structure shown lengthwise along an X-axis direction according to an embodiment of the invention, and FIG. 1B is a vertical cross-sectional view of the crosspoint array structure of FIG. 1A taken along plane A-A;

FIG. 1C shows a top down view of an upper level of the 2-D crosspoint array structure of FIG. 1A taken along the Y-axis direction, and FIG. 1D is a vertical cross-sectional view of the crosspoint array structure 10 of FIG. 1B along the Y-axis direction and particularly taken along the plane B-B' of FIG. 1B;

FIG. 2A depicts a cross-sectional view of a stackable double layer 3-D crosspoint array structure showing a stacked arrangement of two single layer 2-D crosspoint memory array structures corresponding to the 2D crosspoint memory array structure of FIG. 1A lengthwise in an X-axis direction, and FIG. 2B is a vertical cross-sectional view corresponding to a Y-axis direction of a stackable double layer 3-D crosspoint array structure of FIG. 2A taken along a plane C-C;

FIGS. 3A-17D describe a first process flow for forming a stackable 2-D single layer PCM crosspoint memory array structure with a minimal number of masking steps and processing steps used for forming more reliable memory cells;

FIGS. 18A-26D describe a second process flow for forming a stackable 2-D single layer PCM crosspoint memory array structure with a minimal number of masking steps and processing steps used for forming more reliable memory cells; and FIGS. 27A, 27B each depict two stackable 2-D crosspoint PCM memory arrays stacked to form a stackable 3-D crosspoint PCM memory array architecture with each array sharing a common conductor

DETAILED DESCRIPTION

Figure 3A:
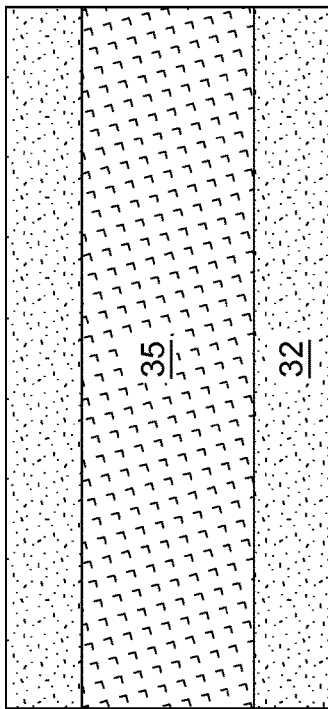

The present disclosure relates to a crosspoint memory array of PCM memory elements and a method of forming a crosspoint memory array of PCM memory elements, which is now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In an embodiment, the present invention is directed to a single-sided liner PCM cell for a crosspoint PCM memory. The crosspoint structure includes vertical, one-sided low electrical resistance drift liner described in FIGS. 3A-17D and enables minimized phase change material feature size that is undamaged, or has minimal damage, by patterning described in FIGS. 18A-26D.

The present disclosure is applicable to a stackable 2-dimensional (2-D) memory array that can be stacked to form a 3-dimensional (3-D) memory array. For purposes of illustration, a 2-dimensional memory array is described having a maximal ideal density of, e.g., a 4F2 (where F is the minimum resolvable feature size). In the crosspoint memory array there is a plurality first and second perpendicular wiring lines with a memory cell and corresponding access device at each of a plurality of intersections of the perpendicular wiring lines. First and second perpendicular wiring lines are alternately referred to herein as wordlines and bitlines, respectively.

FIG. 1A depicts a top down view of an upper level of a stackable single layer 2-D crosspoint memory array semiconductor structure 10 formed in an interconnect dielectric material layer 15. As shown, the crosspoint memory array semiconductor structure 10 dielectric material layer 15 is formed on a lower level interlevel dielectric layer 11 (e.g., a semiconductor substrate) and can connect to further device or conductors (not shown) in lower level 11. As shown in FIG. 1A, structure 10 includes a plurality of conductive bit lines 12 shown lengthwise along an X-axis direction. FIG. 1B is a vertical cross-sectional view of the crosspoint array structure of FIG. 1A taken along plane A-A. Shown in the cross-sectional view of FIG. 1B, is a lower level including a plurality of conductive word lines 22 disposed in perpendicular orientation with respect to the conductive bit line 12. In an embodiment, the bit lines 12 and word lines 22 can be comprised of conductive metal materials (e.g., W, TiN, TaN, Ta, and Cu) and depending upon the technology node, each can have a thickness ranging approximately between 20 nm-50 nm and a width of approximately 20 nm.

Disposed and connected lengthwise along a bitline 12 in the X-direction and attached to each respective wordlines 22 is a respective crosspoint memory element 50, 50A, 50B, etc. each crosspoint memory element including a pillar including at least a resistive memory cell 40 and a series connected access device 30. For purposes of illustration, one memory element 50A is shown in FIG. 1B as attached to a wordline 22A, and includes a respective access device 30A. In between the memory cells 50 is an insulating dielectric material 15 separating each memory cell and bit lines and wordlines. Insulating material 15 can include interlevel dielectric material, such as an oxide (e.g., $SiO_2$), a nitride (e.g., $Si_3N_4$) or other insulator material with low thermal conductivity including, but not limited to: SiOC, SiOH, SiON, SiBN, etc. The resistive memory cell 50 can include but is not limited to the following: phase change memory (PCM), e.g., GeSbTe (germanium-antimony-tellurium or GST), magnetoresistive random access memory (MRAM), resistive random access memory (RRAM), ferroelectric random access memory (FeRAM), organic resistive memory, complex metal oxide, perovskite memory, and oxide resistive memory. For purposes of description, memory cell 40 is hereinafter referred to as a PCM cell. Depending upon the technology node, memory cell 40 can have a height ranging approximately between 30 nm-100 nm and a width approximately between 10 nm-15 nm. In an embodiment the access device 30 can be a switch, e.g., a rectifier diode, e.g., poly-Si diode, a MIEC (mixed ionic electronic conductor) device, an OTS (Ovonics Threshold Switch), or any other etched 2-terminal access device. In an embodiment, depending upon the technology node, access device 30 can have a thickness ranging approximately between 10 nm-30 nm and a width of approximately 20 nm. In embodiments, access device 30 is fabricated to include a first electrode (not shown) connecting a respective word line 22 and a second electrode (not shown) connecting to a first terminal of the memory cell 40. A second terminal of the memory cell 40 connects to the corresponding bit line 12 at a respective intersection.

According to embodiments, as shown in FIG. 1A, the PCM cell is a fill-in PCM cell with a drift stabilizer liner 45 disposed adjacent on one side only. The liner 45 of the PCM cell can be a metal nitride layer (e.g., TaN, TiN, TaSiN, TaAlN, TiAlN, TiSiN). For purposes of illustration, one memory element 50A shown in FIG. 1B includes a respective single-sided liner material layer 45A, and memory element 50B includes a single sided liner 45B. In an embodiment, along the X-axis direction and corresponding to a respective bitline are adjacent memory elements 50A, 50B have respective surfaces of single-sided liner material layer 45A, 45B vertical disposed on sides of the adjacent PCM cell that face each other, while adjacent memory elements 50A, 50C have respective surfaces of PCM cells 40A, 40C that face each other. Along a respective bitline 12, two adjacent memory cells 50 having either liner material 45 surfaces facing each other or PCM cell surfaces 40 facing each other is repeated in an alternating pattern. In embodiments, depending upon the technology node, drift stabilizer liner 45 can have a height ranging approximately between 30 nm-100 nm and a width approximately between 5 nm-10 nm.

FIG. 1C shows a top down view of an upper level of the 2-D crosspoint array structure 10 of FIG. 1A showing the formed plurality of conductive bit lines 12 taken along the Y-axis direction. FIG. 1D is a vertical cross-sectional view of the crosspoint array structure 10 of FIG. 1B along the Y-axis direction and particularly taken along the plane B-B' of FIG. 1B to show respective single-sided liners 40 of memory elements 50 having same face single-side orientation on adjacent PCM cells corresponding to adjacent bitlines 12.

FIG. 2A depicts a cross-sectional view of a stackable double layer 3-D crosspoint array structure showing a stacked arrangement of two single layer 2-D crosspoint memory array structures 10A and 10B corresponding to the array 10 of FIG. 1A lengthwise in an X-axis direction. In the embodiment of FIG. 2A, each of the stacked single layer crosspoint array structures 10A, 10B share a common bitline 13. That is, each of the memory elements 50 of the top memory array structure 10B elements align with corresponding elements 50 of the bottom memory array structure 10A along a shared bitlines 13. FIG. 2B is a vertical cross-sectional view corresponding to a Y-axis direction of a stackable double layer 3-D crosspoint array structure of FIG. 2A taken along a plane C-C. As shown, the view of FIG. 2B is taken along a shared wordline conductor 22A to show exposed surfaces of adjacent PCM memory cells 40 of adjacent memory elements 50 having same face single-side orientation on adjacent PCM cells at respective adjacent bitlines 13 along wordline 22A. In an embodiment, the second top crosspoint memory array structure 10B is formed with a fill-in PCM memory element and top electrode/wiring layer using same methods as described for building a stackable single layer 2-D crosspoint memory array 10.

FIGS. 3A-17D describe a first process flow of the PCM array embodiment of the stackable single layer crosspoint structure that advantageously fabricates the memory arrays 10, 100 with a minimal number of masking steps and processing steps used for forming more reliable memory cells.

Figure 3B:
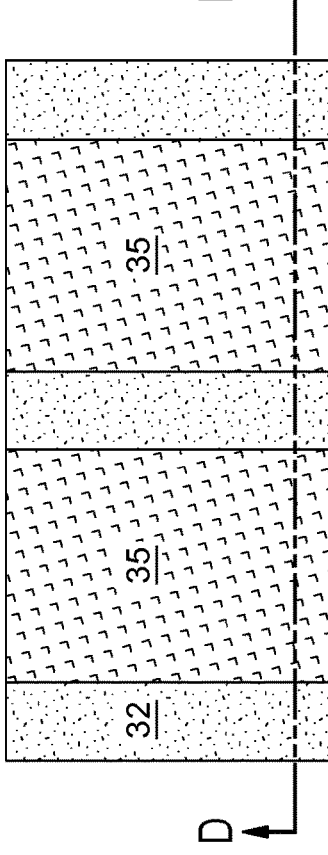
Figure 3C:
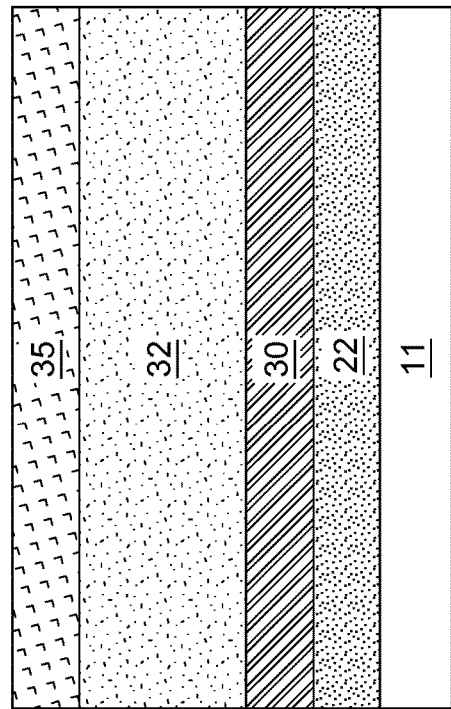
Figure 3D:
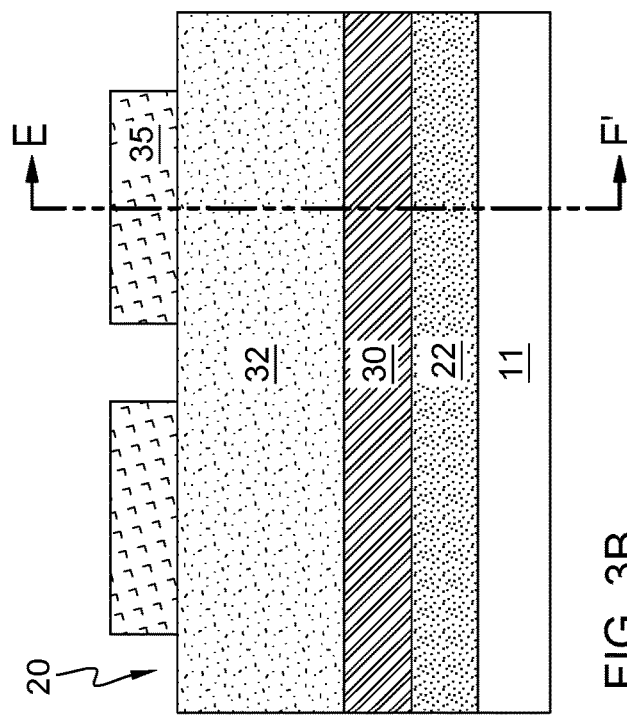

As shown in FIG. 3A, there is depicted a top view of a first exemplary structure 20 according to a first embodiment of the present disclosure taken along an X-direction. FIG. 3B is a vertical cross-sectional view of the first exemplary structure 20 taken along the plane D-D' shown in FIG. 3A. In the view of FIG. 3B, first exemplary structure 20 is formed as a result of various film deposition steps and lithography that include a lower interlevel dielectric material layer 11 that may include conductive connections to further devices (not shown), a bottom electrode layer 22 formed on a surface of the bottom dielectric material layer 11 which is used to for conductive wordline wires, and a formed access device layer 30 which may be a stack of different material layers forming a diode or like two-terminal switching element formed on the bottom conductive electrode layer 22, and a sacrificial layer of dielectric material layer 32 formed above. A further patterned mask layer having mask portions 35 is formed above the sacrificial material layer 32 that is employed to remove portions of the layered structure 20. In an embodiment, the width of the patterned mask resist portions 35 in the X-direction is greater (larger) than the resulting wordline feature size. FIG. 3C is a top view of a portion of the first exemplary structure 20 of FIG. 3A taken along a Y-axis direction. FIG. 3D is a vertical cross-sectional view of the first exemplary structure 20 of FIG. 3A along the Y-direction showing the deposited layers and patterned top mask portion taken along the plane E-E' shown in FIG. 3B.

Figure 4C:
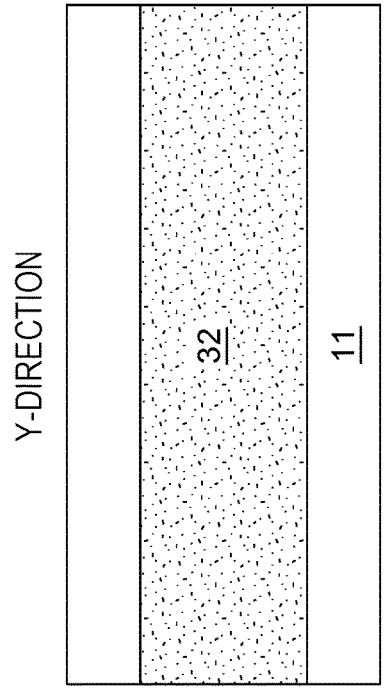
Figure 4D:
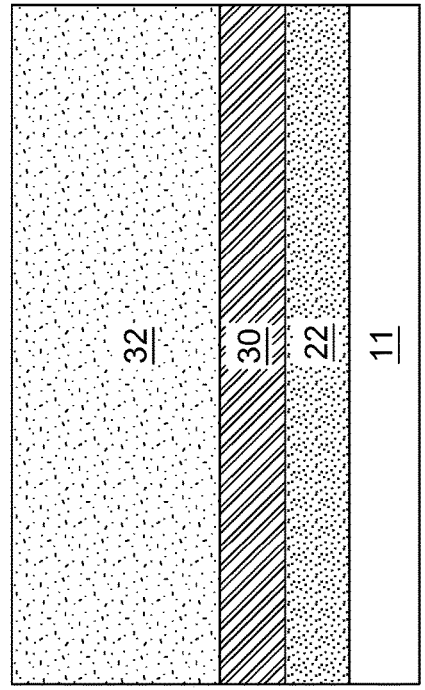
Figure 4A:
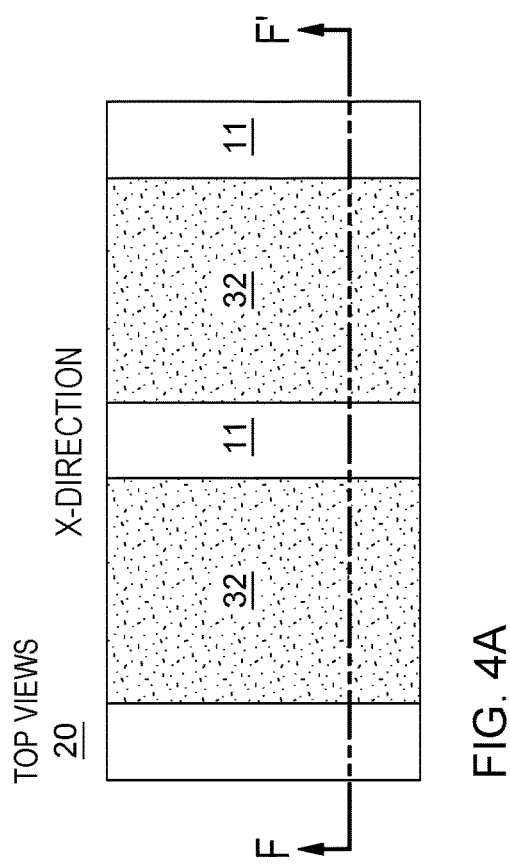
Figure 4B:
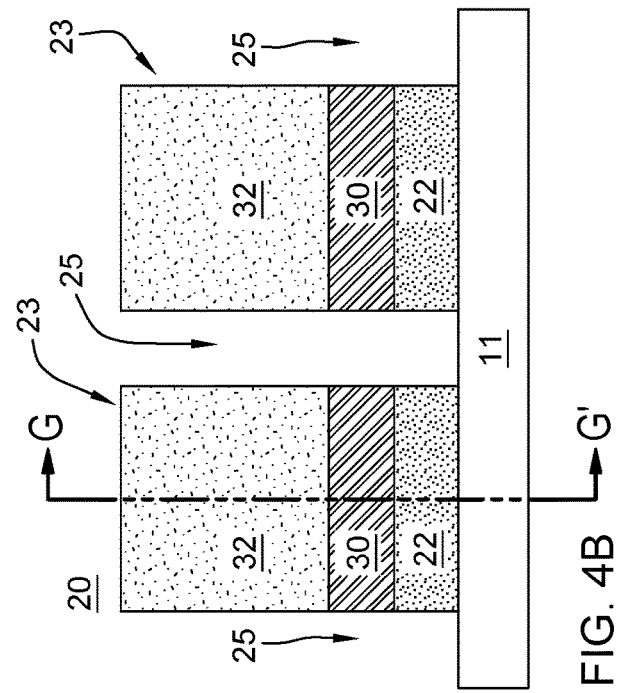

As shown in FIG. 4A, there is depicted a top view of the exemplary structure 20 taken lengthwise along an X-direction of FIG. 3A after performing an anisotropic etch process selective to the resist. FIG. 4B is a vertical cross-sectional view of the first exemplary structure 20 taken along the plane F-F' shown in FIG. 4A showing openings 25 removed as a result of etch processes to result in larger stacks having bottom wordline electrode 22, access device 30 and sacrificial material layer 32. In the view of FIG. 4B along the X-axis direction, after etching selective to the dielectric material layer 11, only vertical stack portions 23 underlying the mask features 32, 30, 22 shown in FIG. 3A remain separated by openings 25, each stack 23 including sidewall surfaces aligned to respective bottom electrode layer 22, the formed access device layer 30 and sacrificial layer of dielectric material layer 32. FIG. 4C is a top view of a portion of the first exemplary structure 20 of FIG. 4A taken from a Y-axis direction. FIG. 4D is a vertical cross-sectional view of the first exemplary structure 20 of FIG. 4A along the Y-axis direction showing the cross-section of a remaining vertical stack portion 23 of the deposited layers taken along the plane G-G' shown in FIG. 4B.

Figure 5A:
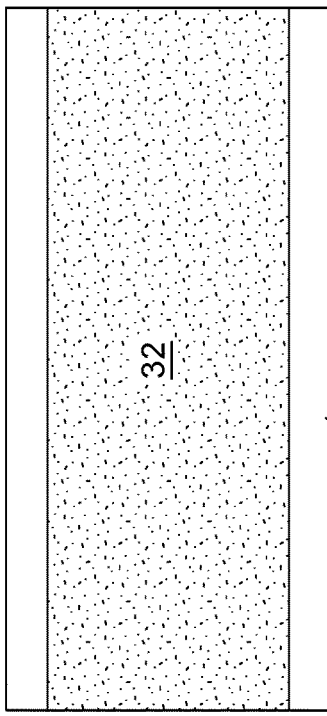
Figure 5C:
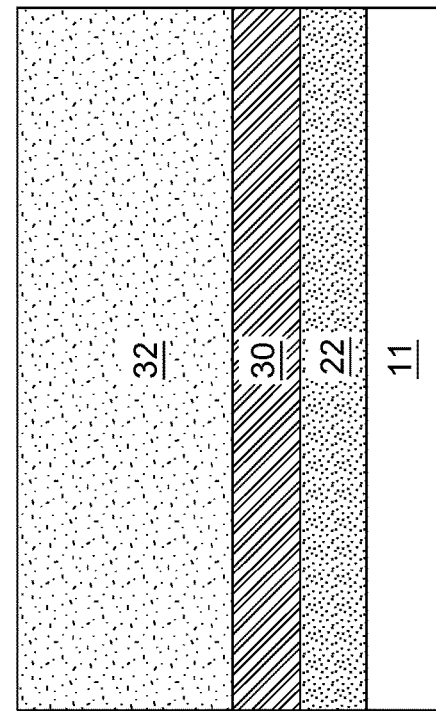
Figure 5B:
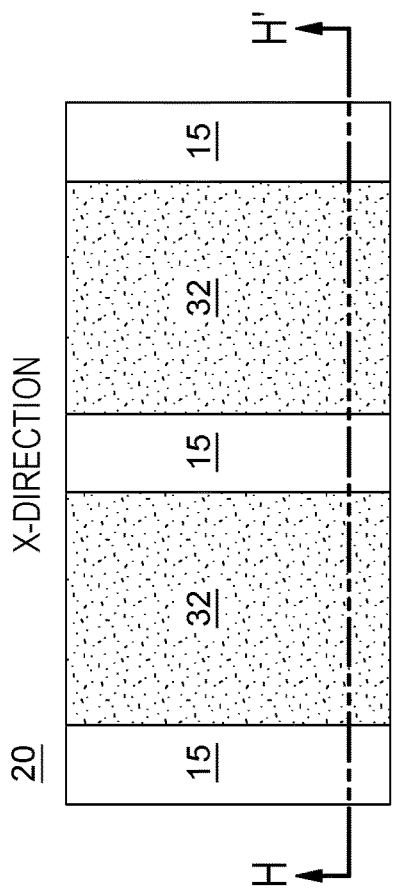
Figure 5D:
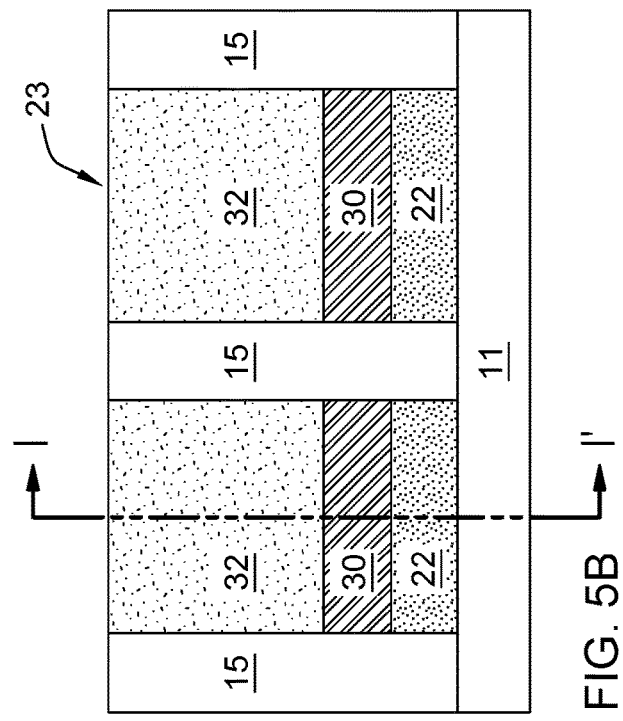

As shown in FIG. 5A, there is depicted a top view of the exemplary structure 20 taken lengthwise along an X-direction of FIG. 4A after performing an encapsulation and planarization processes. The encapsulation includes depositing a disposable fill material 15 over and between the vertical stacks 23 and is subsequently planarized employing the top surfaces of the sacrificial layers 32 as stopping surfaces. The material of the disposable fill material layer 15 can include a semiconductor material, e.g., a dielectric material, such as amorphous carbon, silicon oxynitride, silicon nitride, a dielectric metal oxide, a dielectric metal nitride, an organic material, or any material that is different from the materials comprising the layers of the vertical stacks 23. yes FIG. 5B is a vertical cross-sectional view of the first exemplary structure 20 taken lengthwise along the plane H-H' shown in FIG. 5A. In the view of FIG. 5B along the X-direction, encapsulating disposable dielectric fill material fills openings 25 between the vertical stacks 23 of the aligned bottom electrode layer 22 and the formed access device layer 30 and sacrificial layer of dielectric material layer 32. FIG. 5C is a top view of a portion of the first exemplary structure 20 of FIG. 5A taken from a Y-axis direction. FIG. 5D is a vertical cross-sectional view of the first exemplary structure 20 of FIG. 5A along the Y-direction showing the deposited layers of the vertical stack 23 taken along the plane I-I' shown in FIG. 5B.

Figure 6A:
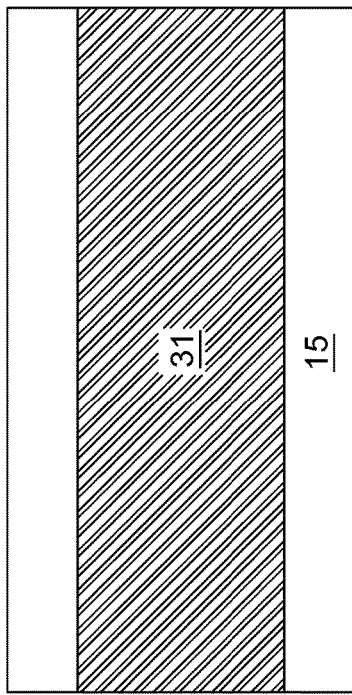
Figure 6C:
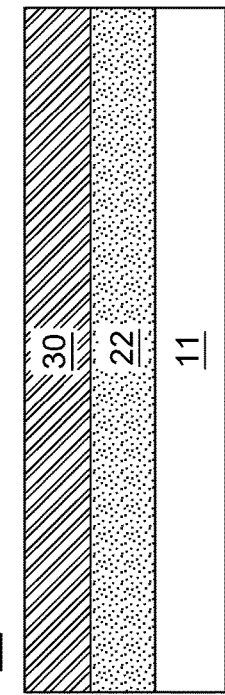
Figure 6B:
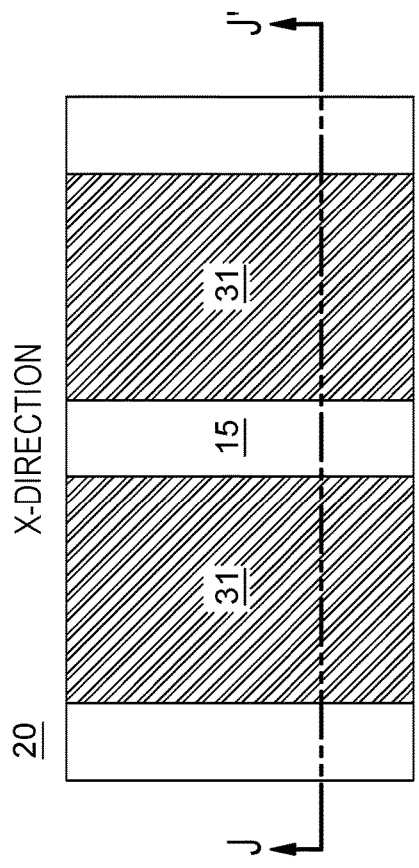
Figure 6D:
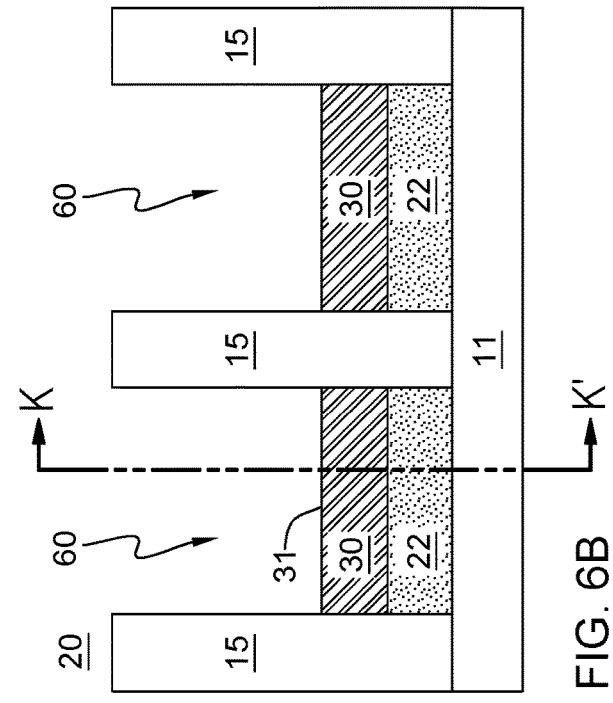

As shown in FIG. 6A, there is depicted a top view of the exemplary structure 20 taken lengthwise along an X-axis direction of FIG. 5A after removing sacrificial material layers 32 of each vertical stack portion 23, e.g., using an anisotropic etch or an isotropic etch (e.g., wet or plasma etch). FIG. 6B is a vertical cross-sectional view of the first exemplary structure taken along the plane J-J' shown in FIG. 6A. In the cross-sectional view of FIG. 6B taken along the X-direction, the sacrificial layers of stacks 23 are shown removed selective to the disposable dielectric material 15 and a surface 31 of access device layer 30 leaving openings or trenches 60 defined by adjacent vertically oriented disposable dielectric fill structures 15. FIG. 6C is a top view of a portion of the first exemplary structure 20 of FIG. 6A taken lengthwise along a Y-axis direction. FIG. 6D is a vertical cross-sectional view of the exemplary structure of FIG. 6A along the Y-axis direction showing remaining portions of etched vertical stack including the conductive electrode (wordline) 22 and access device layer 30 taken along the plane K-K' shown in FIG. 6B.

Figure 7A:
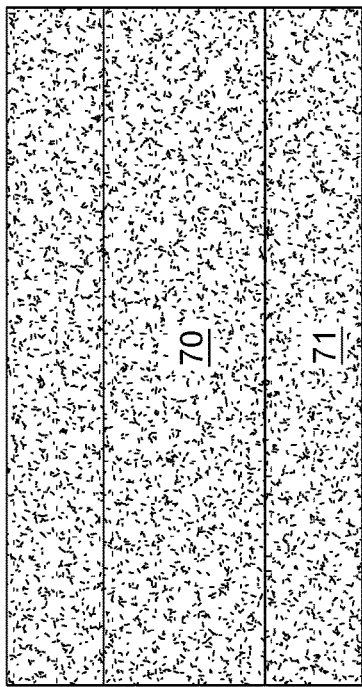
Figure 7C:
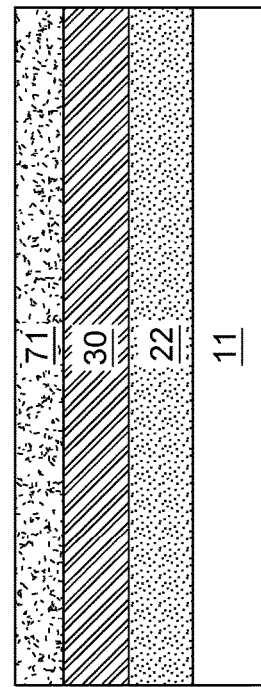
Figure 7B:
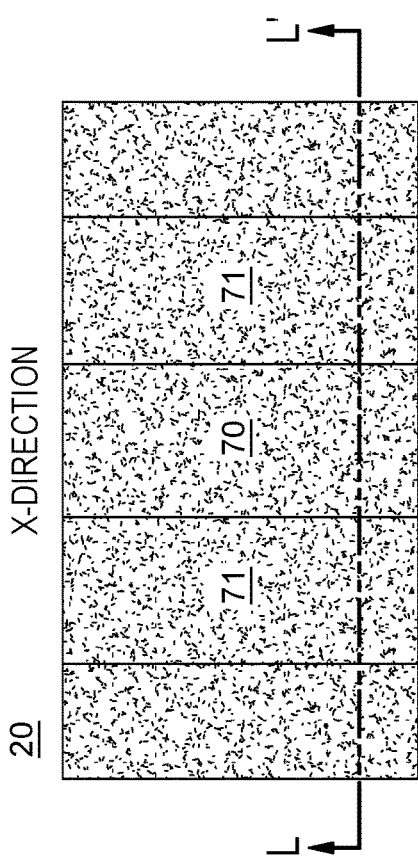
Figure 7D:
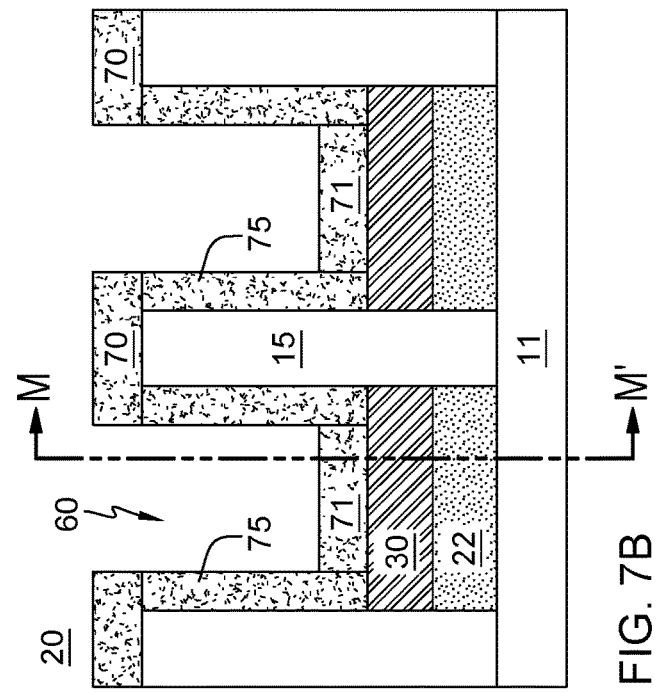

As shown in FIG. 7A, there is depicted a top view of the exemplary structure 20 taken lengthwise along an X-axis direction of FIG. 6A after depositing a resistance (Rs) tuned liner material layer 70. In an embodiment, Rs tuned (metal) liner material can be deposited by a conformal deposition method. For example, Rs tuned liner material 70 such as a metal nitride layer (e.g., TaN, TiN, TaSiN, TaAlN, TiAlN, TiSiN) can be deposited by chemical vapor deposition (CVD), physical vapor deposition (PVD), atomic layer deposition (ALD), or a combination thereof. By "conformal" it is meant that the deposition provides a film that defines a morphologically uneven interface with another body and has a thickness that is substantially the same (i.e., ±10 Angstroms) everywhere along the interface. The thickness of the nitride material liner 70 can be from 5 nm to 10 nm, although lesser and greater thicknesses can also be employed. FIG. 7B shows a vertical cross-sectional view of the first exemplary structure 20 taken along the plane L-L' shown in FIG. 7A. In the view of FIG. 7B along the X-axis direction, tuning Rs liner material 70 includes liner portions 71 deposited to encapsulate the exposed surface of the access device layer 30 within each opening 60, liner portions 70 encapsulating exposed top surfaces of each vertical oriented disposable fill dielectric structure 15 and liner portions 75 formed along each sidewall of each of the vertical oriented disposable fill dielectric structures 15 defining formed openings 60. FIG. 7C is a top view of a portion of the first exemplary structure 20 of FIG. 7A taken from a Y-axis direction. FIG. 7D is a vertical cross-sectional view of the first exemplary structure 20 of FIG. 7A along the Y-axis direction showing the deposited conformal coating of liner material 71 on the vertical stack comprising access device layer 30 overlying electrode layer 22 as taken along the plane M-M' shown in FIG. 7B.

Figure 8A:
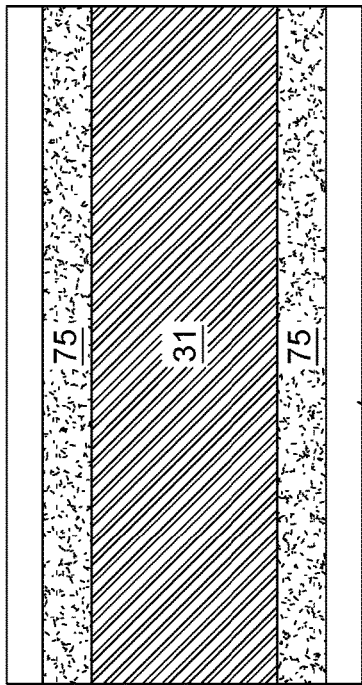
Figure 8C:
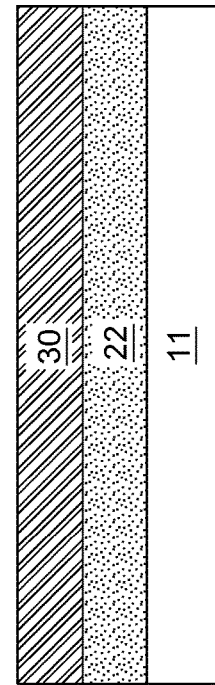
Figure 8B:
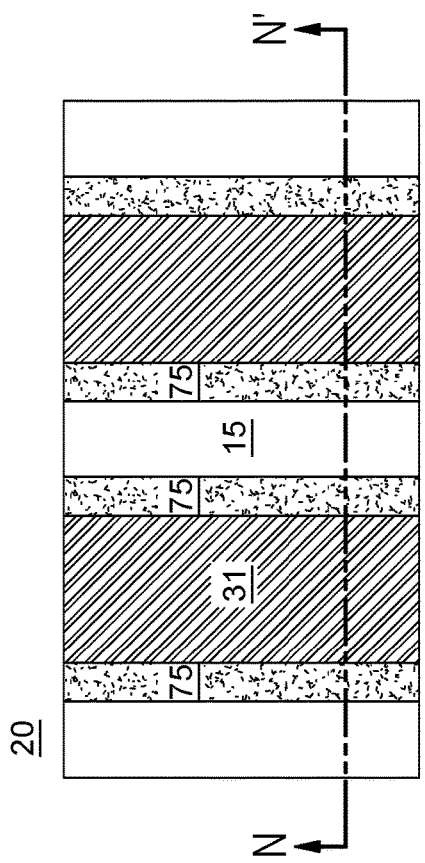
Figure 8D:
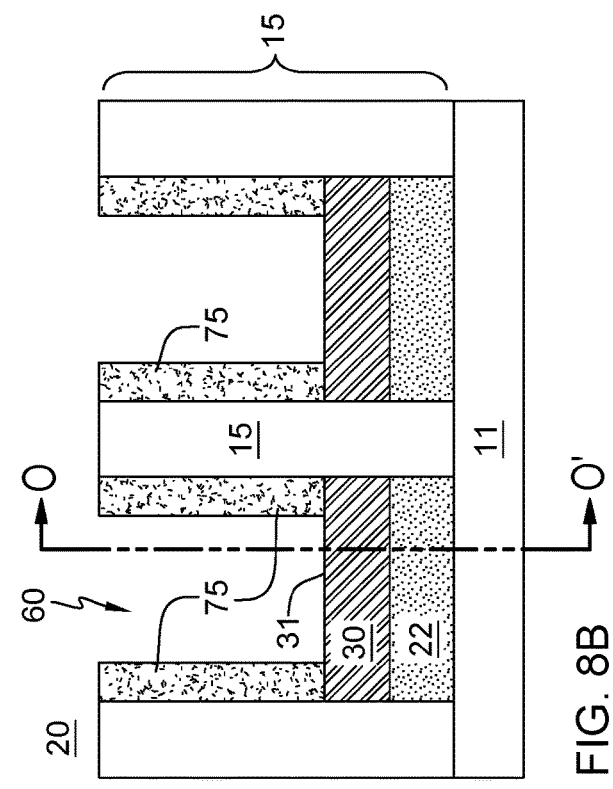

As shown in FIG. 8A, there is depicted a top view of the exemplary structure 20 taken lengthwise along an X-axis direction of FIG. 7A after removing portions 71 of the Rs tuning liner material layer 70 using a highly directional etch process selective to the access device layer 30. FIG. 8B is a vertical cross-sectional view of the first exemplary structure 20 taken along the plane N-N' shown in FIG. 8A. In the view of FIG. 8B along the X-axis direction, portions 70 of the Rs tuning liner material layer are shown removed above the access device layer 30 thereby exposing the surface 31 of the one terminal of the access device 30. Tuning Rs liner material 70 is additionally removed from top surfaces of the disposable dielectric fill material structures 15 defining the openings 60. Further, as shown in FIG. 8B, there remains a tuning Rs liner material layer 75 vertically oriented on each sidewalls of the trenches 60 defined by the vertically positioned disposable dielectric fill material structures 15. FIG. 8C is a top view of a portion of the first exemplary structure 20 of FIG. 8A taken along a Y-axis direction. FIG. 8D is a vertical cross-sectional view along the Y-direction of the exemplary structure of FIG. 8A particularly taken along line O-O' shown in FIG. 8B to show one vertical stack along the Y-direction including the conductive electrode (wordline) 22 and access device layer 30.

Figure 9A:
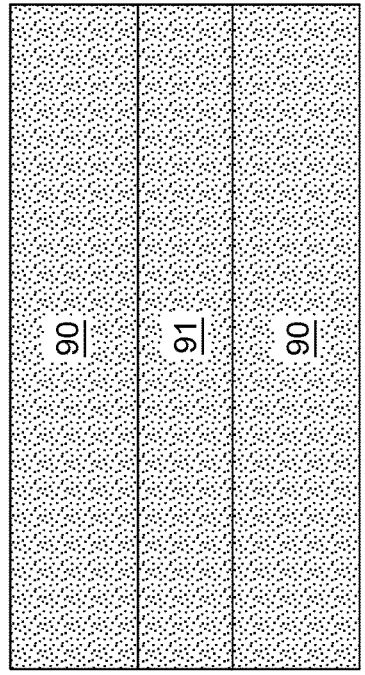
Figure 9C:
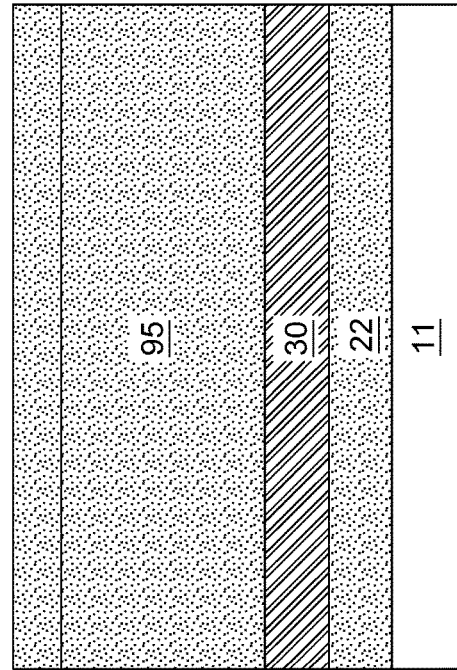
Figure 9B:
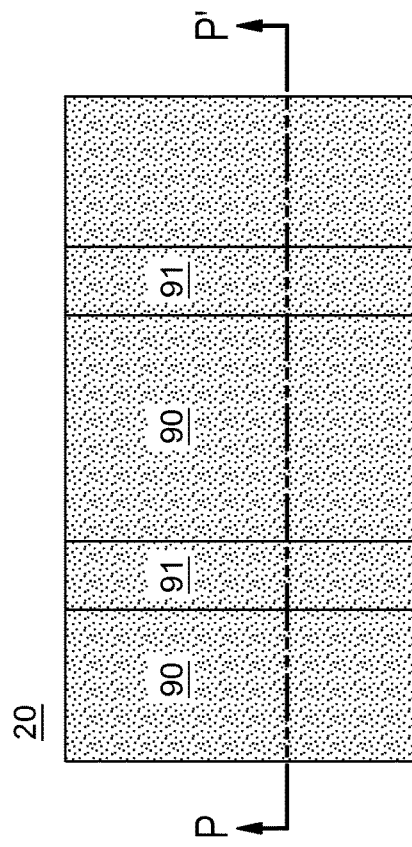
Figure 9D:
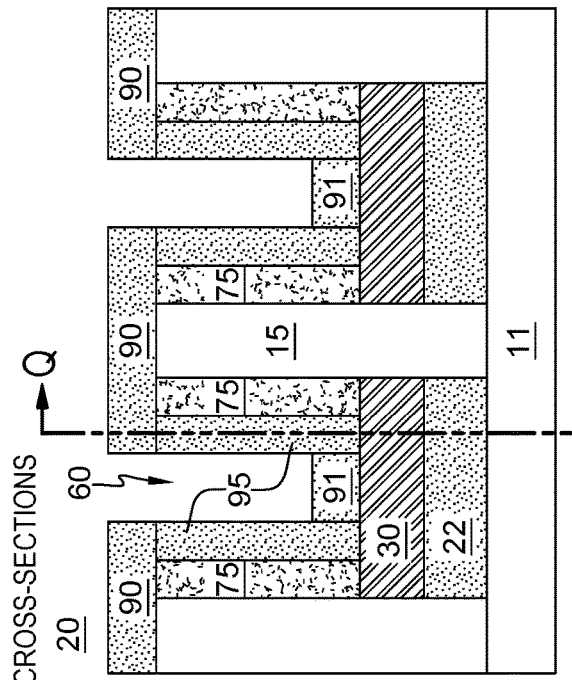

As shown in FIG. 9A, there is depicted a top view of the exemplary structure 20 taken lengthwise along an X-axis direction of FIG. 8A after depositing a sacrificial liner material 90 such as Si, SiN, SiO2, C. In an embodiment, sacrificial liner material 90 can be deposited by a conformal deposition method, e.g., CVD, PVD, ALD, or a combination thereof. FIG. 9B shows a vertical cross-sectional view of the first exemplary structure 20 taken along the plane P-P' shown in FIG. 9A. In the view of FIG. 9B along the X-axis direction, sacrificial liner material 90 encapsulates top surfaces of disposable fill material structures 15, include portions 91 deposited to encapsulate the exposed surfaces 31 of the access device layer 30 at the bottom of each opening 60, and include portions 95 encapsulating within opening 60 exposed sidewall surfaces of each vertical oriented Rs tuning liner material structure 75 in the openings 60. FIG. 9C is a top view of a portion of the first exemplary structure of FIG. 9A taken lengthwise from a Y-axis direction. FIG. 9D is a vertical cross-sectional view along the Y-direction of the first exemplary structure 20 of FIG. 9A taken along the plane Q-Q' shown in FIG. 9B.

Figure 10A:
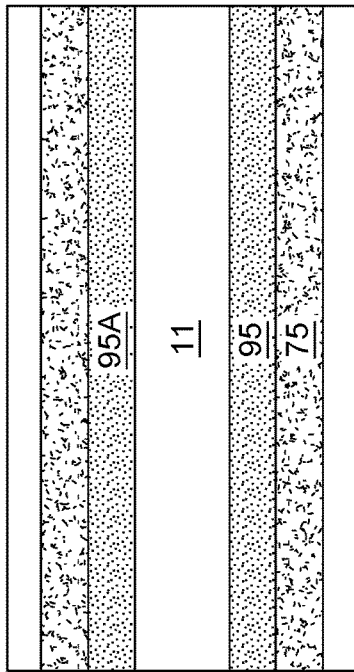
Figure 10C:
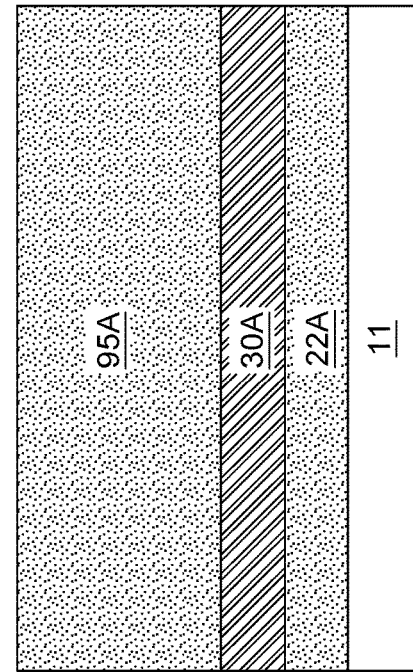
Figure 10B:
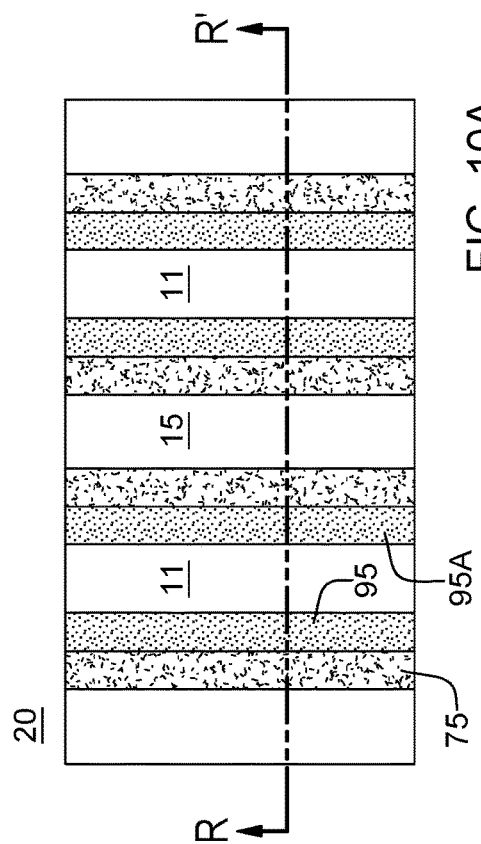
Figure 10D:
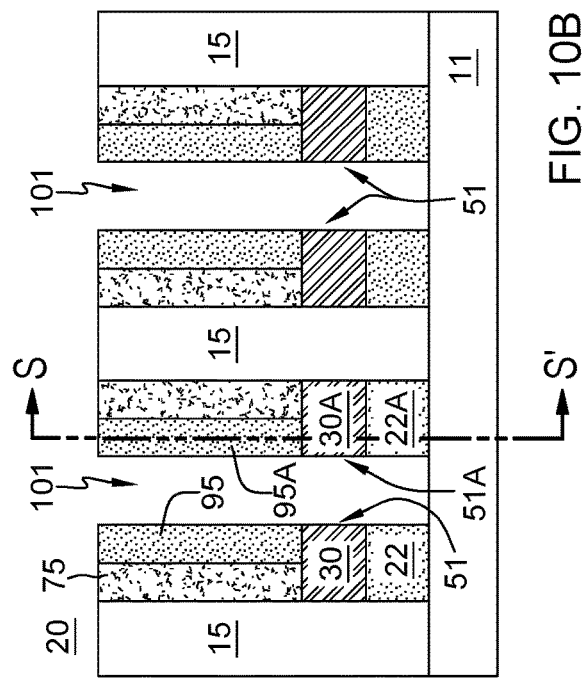

As shown in FIG. 10A, there is depicted a top view of the exemplary structure 20 taken along an X-axis direction of FIG. 9A after lithographic patterning and etching to remove from the trenches 60 the layer 91 of sacrificial liner material deposited on a top surface of the access device, and a removal, by etching, of a portion of the underlying access device layer 30 and a portion of wordline electrode 22 selective to a surface of the lower level interconnect dielectric layer 11 to result in the formation of new high aspect ratio openings 101 in structure 20. FIG. 10B is a vertical cross-sectional view of the first exemplary structure 20 taken along the plane R-R' shown in FIG. 10A. As shown in FIG. 10B, the vertical stack structures remaining within openings 60 is effectively etched to render the formed opening 101 that effectively doubles the pitch of the memory elements along the X-axis direction (doubling density) by defining two discrete vertical structures 51, 51A, each structure of feature size (sub-lithographic) dimensions, each vertical structure 51, 51A being disposed adjacent a respective vertical oriented disposable fill material structure 15 and each structure 51, 51A including: a conductive wordline layer portion 22, 22A of feature width, a portion 30, 30A of the overlying access device layer of reduced width, and atop the access device layer portions 30, 30A of reduced width, and in alignment therewith, vertically-oriented adjacent sub-lithographic portions of Rs tuning liner material 75 and the inner sacrificial liner material layers 95, 95A. FIG. 10C is a top view of a portion of the first exemplary structure 20 of FIG. 10A taken lengthwise along a Y-axis direction. FIG. 10D is a vertical cross-sectional view lengthwise along the Y-axis direction of the first exemplary structure 20 of FIG. 10A taken along the plane S-S' shown in FIG. 10B.

Figure 11A:
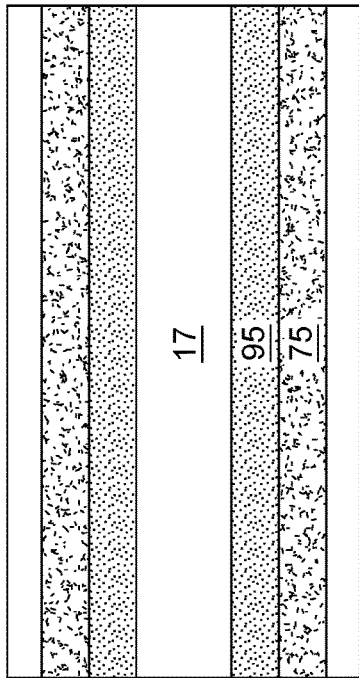
Figure 11C:
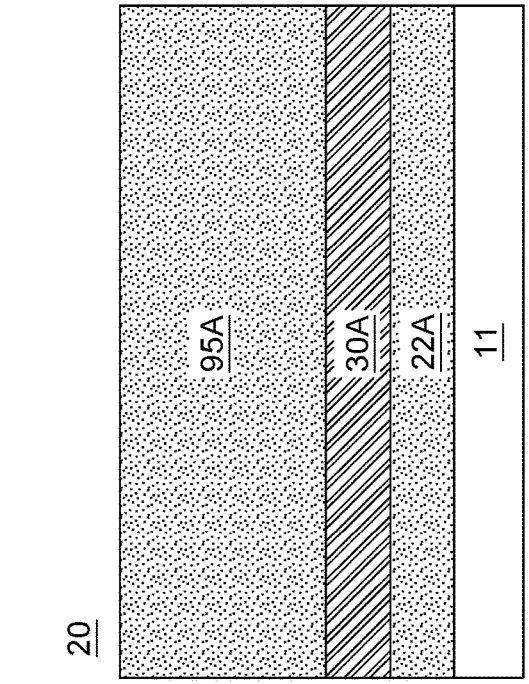
Figure 11B:
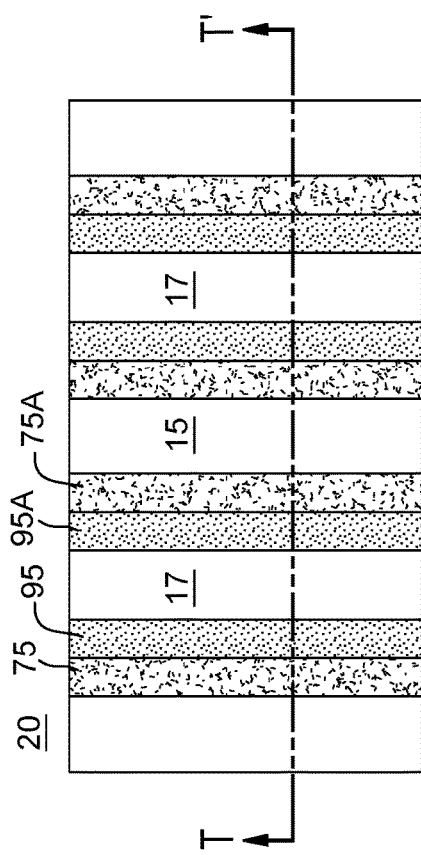
Figure 11D:
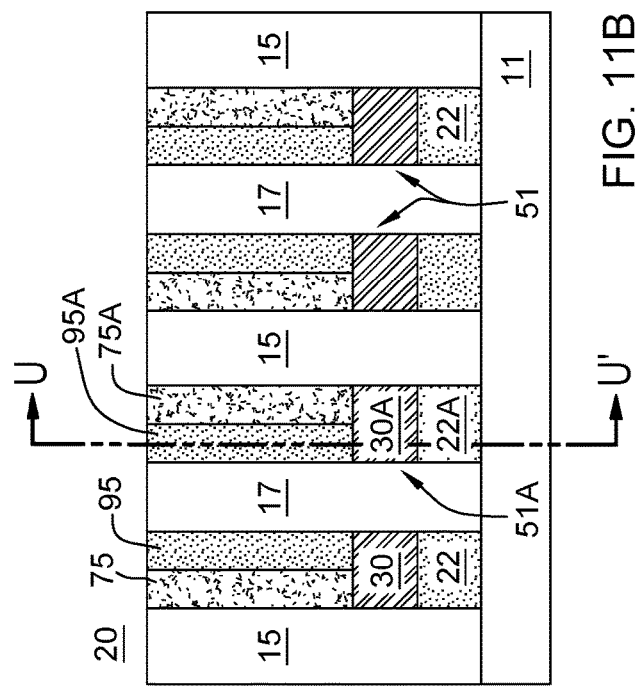

As shown in FIG. 11A, there is depicted a top view of the exemplary structure 20 taken lengthwise along the X-axis direction of FIG. 10A after performing an encapsulation and planarization processes. The encapsulation includes depositing a further disposable dielectric fill material 17 in each of the defined openings 101 between the two discrete vertical structures 51, 51A. along adjacent wordlines of FIG. 10B and subsequently planarizing the top surface employing the top surfaces of the sacrificial liner material 95 as a stopping surface. The material of the disposable fill material layer 17 can be the same semiconductor material as in structures 15 including, but not limited to a semiconductor material, e.g., a dielectric material, such as amorphous carbon, silicon oxynitride, silicon nitride, a dielectric metal oxide, a dielectric metal nitride, an organic material, or any material that is different from the materials comprising the layers of the two discrete vertical structures 51. FIG. 11B is a vertical cross-sectional view of the first exemplary structure 20 taken along the plane T-T' shown in FIG. 11A. In the view of FIG. 11B taken lengthwise along the X-axis direction, encapsulating disposable dielectric fill material 17 is deposited to fill openings 101 between the vertical stacks 51 of the aligned memory elements including bottom interlevel electrode layer (wordline) 22, the formed access device layer 30 and adjacent sub-lithographic vertically oriented portions of Rs (sheet resistance) tuning liner material 75 and the sacrificial liner material layer 95. One vertical stack memory element 51A of the memory elements 51 include bottom interlevel electrode layer (wordline) 22, a formed access device layer portion 30A and adjacent sub-lithographic vertically oriented portions of Rs tuning liner material 75A and the sacrificial liner material layer 95A. FIG. 11C is a top view of a portion of the first exemplary structure of FIG. 11A lengthwise taken along a Y-axis direction. FIG. 11D is a vertical cross-sectional view of the first exemplary structure 20 of FIG. 11A along the Y-axis direction showing the deposited layers of a particular vertical stack 51A taken along the plane U-U' shown in FIG. 11B. The planarization of the deposited disposable dielectric material 17 at the surface can be performed by chemical mechanical planarization (CMP). The top surfaces of the planarization disposable dielectric material 15, 17 can be coplanar with the top surfaces of the adjacent sub-lithographic portions of Rs tuning liner material layer 75 and the sacrificial liner material 95, 95A.

Figure 12A:
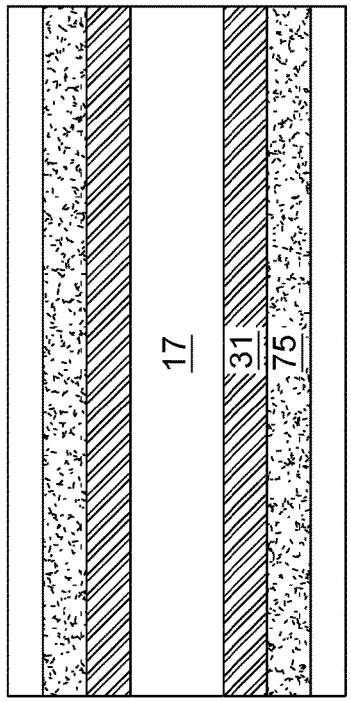
Figure 12B:
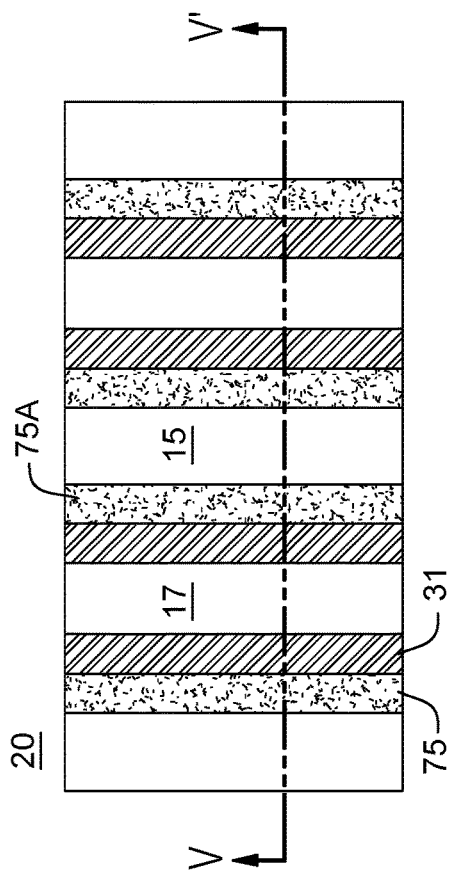
Figure 12C:
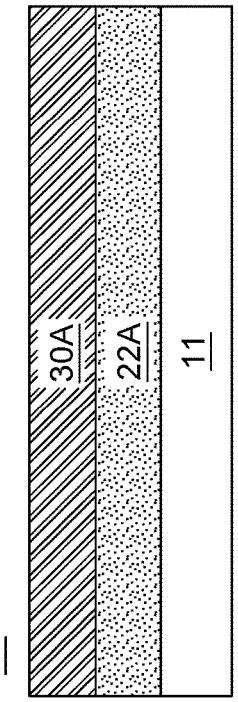
Figure 12D:
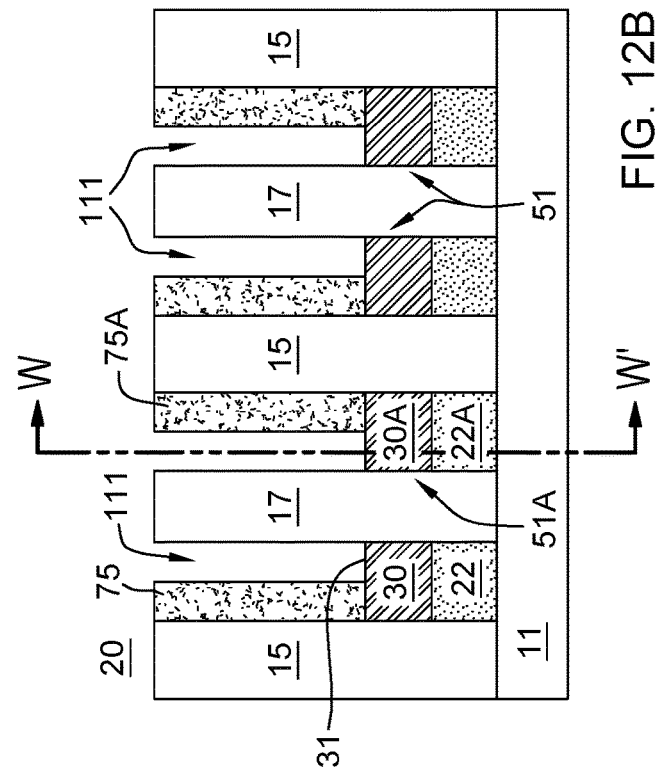

As shown in FIG. 12A, there is depicted a top view of the exemplary structure 20 taken lengthwise along the X-axis direction of FIG. 11A after removing the sub-lithographic sacrificial liner material layer portions 95, 95A of each memory element vertical stack 51, 51A, e.g., using a anisotropic etch or an isotropic etch (plasma or wet etch). FIG. 12B is a vertical cross-sectional view of the first exemplary structure 20 taken along the plane V-V' shown in FIG. 12A. In the view of FIG. 12B along the X-axis direction, the sacrificial liner layers 95, 95A are shown removed selective to the sub-lithographic Rs tuning liner material 75, disposable dielectric material 15, 17 and access device material layer 30. The resulting etched structure after removing sacrificial liners shows remaining sub-lithographic size openings 111 in each adjacent memory element vertical stack 51, 51A structure. The resulting structure shows the sub-lithographic size Rs tuning liner material layers 75 disposed on either side of a vertical oriented dielectric material structure 15 in an alternating pattern. FIG. 12C is a top view of a portion of the first exemplary structure of FIG. 12A taken lengthwise from a Y-axis direction. FIG. 12D is a vertical cross-sectional view along the Y-axis direction of the exemplary structure of FIG. 12A particularly taken along line W-W' shown in FIG. 12B to show one vertical stack 51A along the Y-axis direction including the conductive electrode (wordline) 22A and access device layer 30A.

Figure 13A:
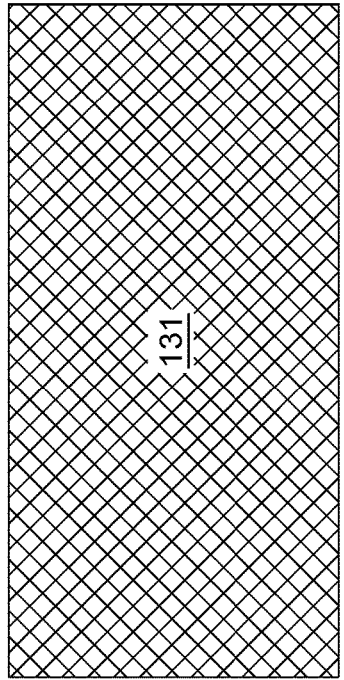
Figure 13C:
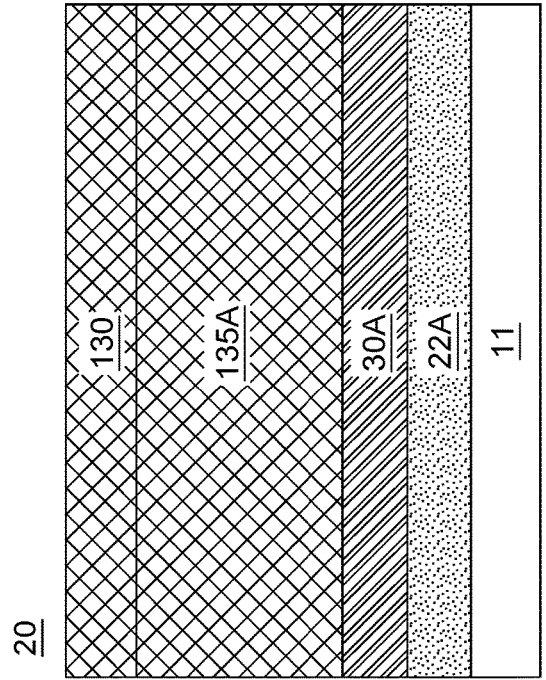
Figure 13B:
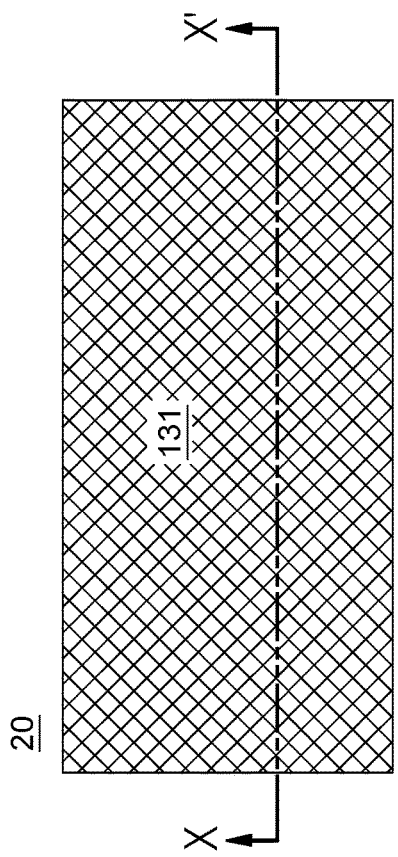
Figure 13D:
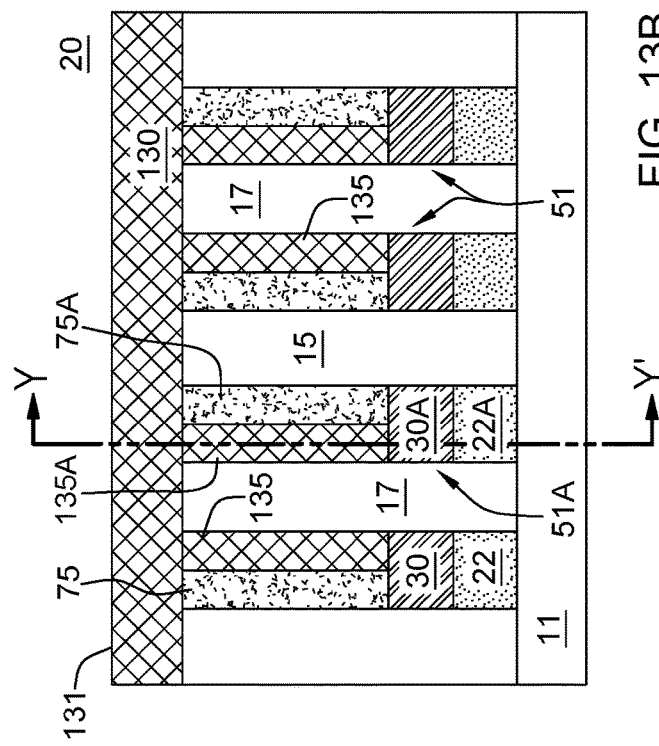

As shown in FIG. 13A, there is depicted a top view of the exemplary structure 20 taken lengthwise along an X-axis direction of FIG. 12A after depositing a PCM memory device material 130, e.g., a GST layer having a top surface 131, on the structure of FIG. 12A. FIG. 13B is a vertical cross-sectional view of the first exemplary structure 20 taken along the plane X-X' shown in FIG. 13A. In an embodiment, PCM memory device material can be deposited by a conformal deposition method. For example, GST material layer 130 can be deposited by chemical vapor deposition (CVD), physical vapor deposition (PVD), atomic layer deposition (ALD), or a combination thereof. In the view of FIG. 13B taken along the X-axis direction, the GST material layer 130 is shown deposited as layers 135, 135A within and filling the sub-lithographic size openings 111 disposed in a respective vertical oriented disposable dielectric material structure 51, 51A adjacent a respective single-sided Rs tuning liner layer 75, 75A, and further deposited on the top surface as GST layer 130. FIG. 13C is a top view of a portion of the first exemplary structure of FIG. 13A taken lengthwise along a Y-axis direction. FIG. 13D is a vertical cross-sectional view of the first exemplary structure 20 of FIG. 13A along the Y-axis direction showing the deposited GST layers of the resulting vertical stack when taken along the plane Y-Y' that includes memory element 51A as shown in FIG. 13B. As seen, memory element 51A shown in FIG. 13B includes a bottom wordline electrode 22A, access device layer 30A, vertically disposed sub-lithographic Rs tuning liner material layer 75A, and deposited GST sidewall portion 135A and top layer portion 170.

As shown in FIG. 14A, there is depicted a top view of the exemplary structure 20 taken lengthwise along an X-direction of FIG. 13A after performing a GST planarization process. The planarization can include a CMP (polish) to remove the GST layer 130 formed on the structure 20 top surface and planarize the top surface employing the top surfaces of the Rs tuning liner material as a stopping surface to ensure top surfaces coplanarity. FIG. 14B is a vertical cross-sectional view of the first exemplary structure 20 taken along the plane Z-Z' shown in FIG. 14A. The view of FIG. 14B taken along the X-axis direction shows a top surface without the GST layer. FIG. 14C is a top view of a portion of the first exemplary structure 20 of FIG. 14A taken from a Y-axis direction. FIG. 14D is a vertical cross-sectional view of the first exemplary structure 20 of FIG. 14A along the Y-axis direction showing the deposited layers of the vertical memory element stack 51A taken along the plane a-a' shown in FIG. 14B.

As shown in FIG. 15A, there is depicted a top view of the exemplary structure 20 taken lengthwise along the X-direction of FIG. 14A after depositing a conductive metal (e.g., Cu, W) and performing lithographic perpendicular patterning of a mask layer (not shown) over the top surface to form a top electrode pattern which pattern includes conductive bitlines 150, 150A oriented perpendicular to the direction of the wordlines 22, 22A. In an embodiment, a resist mask layer is deposited and etched to pattern a perpendicular orientation of a deposited top electrode metal material. The patterned top electrode pattern forms bitlines 150 in an orientation perpendicular to the bottom electrode or wordline 22. FIG. 15B is a vertical cross-sectional view of the first exemplary structure taken along the plane b-b' through a deposited bitline electrode or wire 150A shown in FIG. 15A. FIG. 15C is a top view of a portion of the first exemplary structure of FIG. 15A taken from a Y-axis direction showing the patterned and formed bitline electrodes 150, 150A. FIG. 15D is a vertical cross-sectional view of the first exemplary structure 20 of FIG. 15A taken along the Y-axis direction showing the patterned and deposited bitline electrode conductor layers 150, 150A formed above the surface of the memory stack structure taken along the plane c-c' shown in FIG. 15B.

Figure 16C:
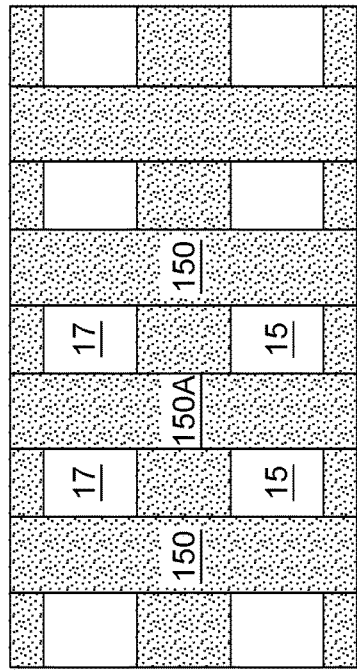
Figure 16A:
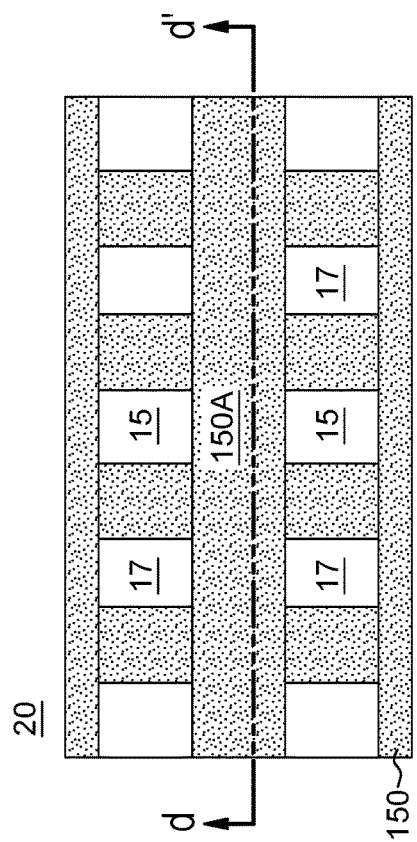
Figure 16D:
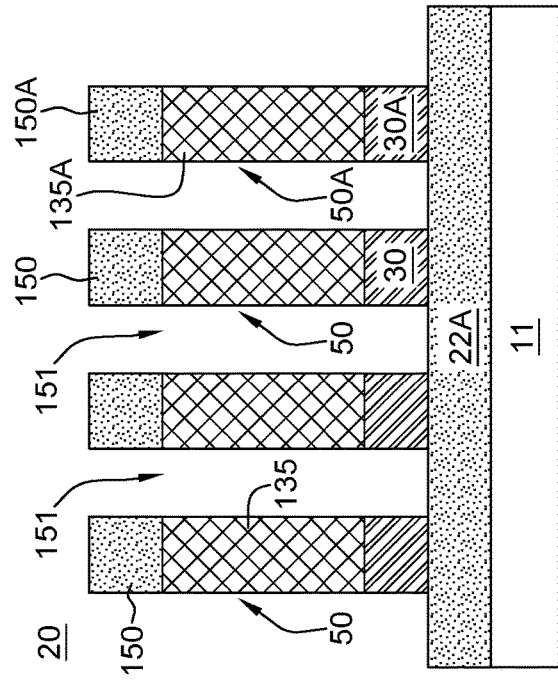
Figure 16B:
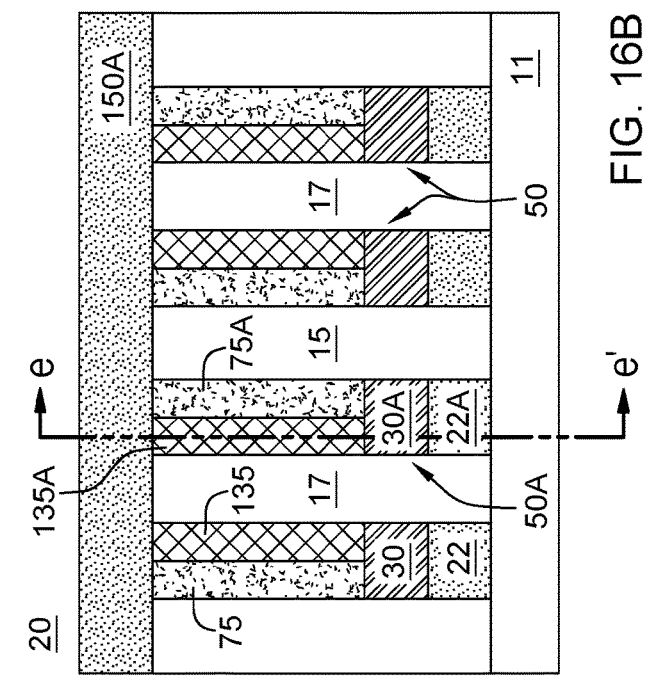

As shown in FIG. 16A, there is depicted a top view of the exemplary structure 20 of FIG. 15A taken lengthwise along the X-axis direction after performing a perpendicular cut etch (e.g., a highly directional plasma etch) in the opposite (Y-axis) direction, to remove PCM, access device material layers in a perpendicular direction between each of the formed bitline conductors 150 and stopping on the respective wordline electrode 22, 22A (in the X-direction perpendicular to the top bitline electrode). FIG. 16B is a vertical cross-sectional view of the first exemplary structure taken along the plane d-d' shown in FIG. 16A showing the top electrode pattern after the perpendicular etch. In the view of FIG. 16B, plural of vertical oriented memory elements or pillars 50, 50A and their respective access devices 30, 30A connect a bottom wordline electrode 22, 22A to a single perpendicular oriented top bitline electrode structure, e.g., bitline 150A. The disposable dielectric fill material 15, 17 is shown remaining between each vertically oriented memory stack 50, 50A along a respective wordline (X-axis direction) 150, 150A. FIG. 16C is a top view of a portion of the first exemplary structure of FIG. 16A taken lengthwise along a Y-axis direction showing the patterned and formed bitline electrodes 150, 150A. FIG. 16D is a vertical cross-sectional view of the first exemplary structure 20 of FIG. 16B taken lengthwise along the Y-axis direction showing the deposited bitline electrode conductor layers 150, 150A and the pattern of vertically oriented memory element stacks 50, 50A along a respective wordline, e.g., wordline 22A when taken along the plane e-e' along a single wordline electrode 22A as shown in FIG. 16B. In particular, as shown in FIG. 16D, the perpendicular cut etch in effect removes memory stack material 135 between each of the formed bitline conductors 150 selective to the bitline and the underlying wordline conductors to leave the individual PCM memory stacks or pillars 50, 50A vertically oriented and self-aligned to a corresponding bitline electrode 150, 150A. The perpendicular etching further opens up a high aspect ratio space 151 between each vertically oriented individual self-aligned memory pillars 50, 50A along a respective wordline 22, 22A. That is, in view of FIG. 16D, formed beneath each bitline electrode 150, 150A is a corresponding vertically oriented PCM memory stack or pillar 50, 50A self-aligned to the corresponding bitline, and to each including respective access device 30, 30A. That is, vertically oriented memory cell pillar structure 50, 50A including access device 30, 30A and the respective overlying vertically-oriented adjacent sub-lithographic layers of Rs tuning liner material 75, 75A and the GST PCM material 135, 135A remain that have sidewalls self-aligned to the feature dimensions of a respective top conductive bitline electrode 150, 150A. Given that etch is a perpendicular etch cut is a self-aligned process with the bitline conductor 150, 150A functioning as a hardmask, there is prevented or eliminated any damage to the sub-lithographic GST material portions.

Figure 17A:
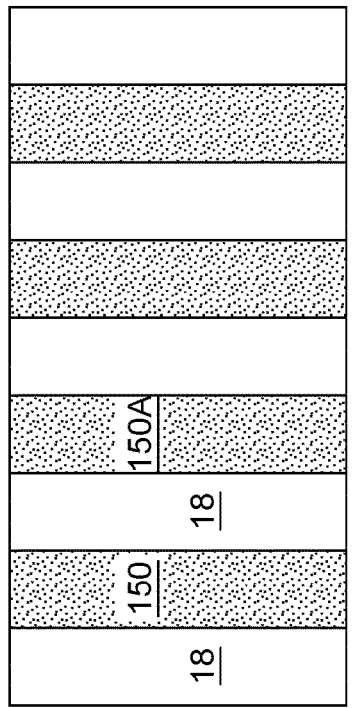
Figure 17B:
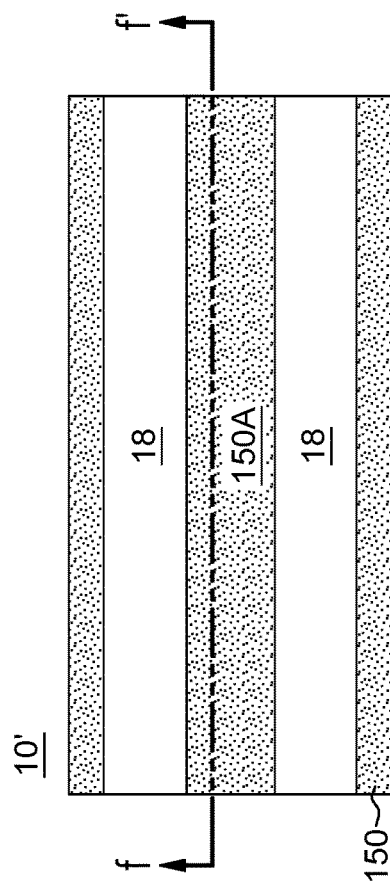
Figure 17C:
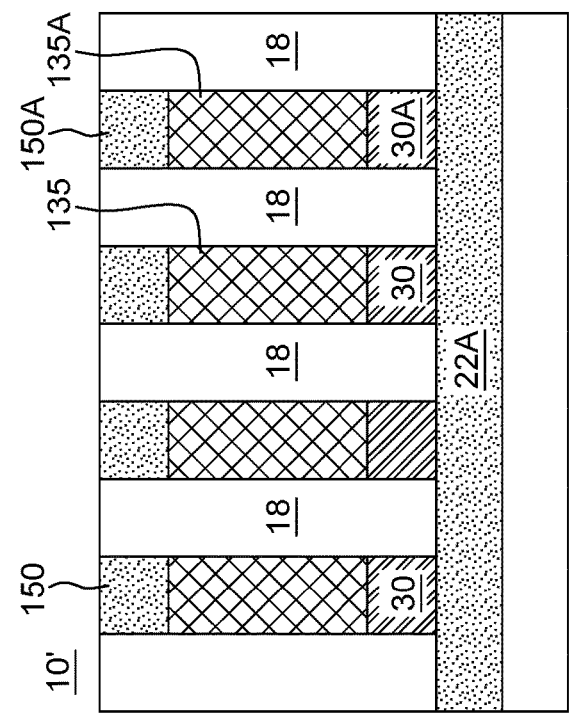
Figure 17D:
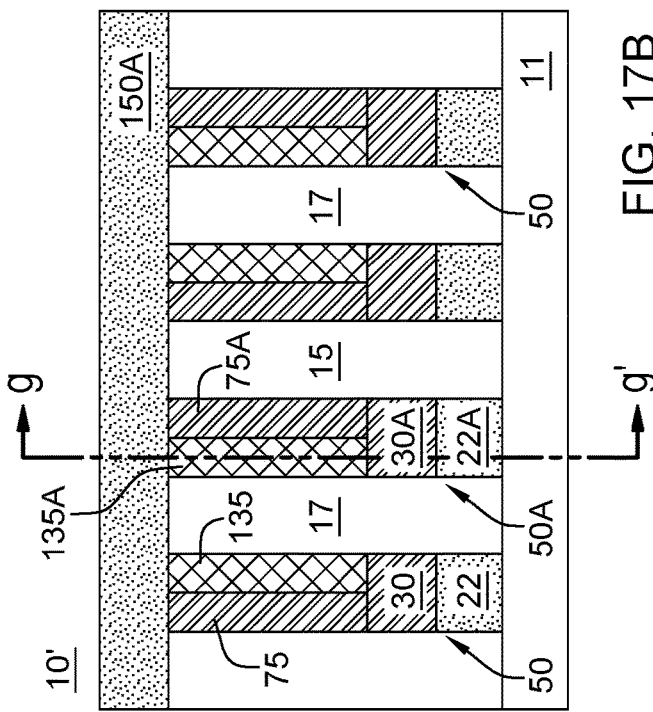

FIGS. 17A-17D shows the completed PCM memory cell array structure 10' such as the crosspoint array 10 shown and described with respect to FIGS. 1A-1D. In particular, FIG. 17A depicts a top view of the exemplary structure 10' taken lengthwise along an X-direction of FIG. 16A after performing an encapsulation (a dielectric material fill) and planarization processes. The encapsulation includes depositing a dielectric fill material 18 in the remaining spaces 151 between memory pillar structures 50, 50A of FIG. 16D and using CMP to planarize a top surface of the structure to remove any excess deposited dielectric material to complete the forming of a stackable single layer 2-D crosspoint array structure 10' according to a first embodiment. FIG. 17B is a cross-sectional view of the final crosspoint array structure of FIG. 17A taken along plane f-f' through a top bitline electrode 150A. In the vertical cross-sectional view of the first exemplary structure 10' of FIG. 17B there is depicted along a bitline electrode 150A adjacent formed vertical memory pillar structures 50, 50A each including a respective PCM memory cell 135, 135A with each memory element having a vertical, low electrical resistance drift mitigating metal liner 75, 75A on a single side (i.e., one-sided liner). The metal liner resistance is greater than the resistance of the PCM material when crystallized but is lower than the PCM material resistance when amorphous and is used to prevent resistance drift in PCM cells. FIG. 17C is a top view of a portion of the first exemplary structure 10A of FIG. 17A taken along a Y-axis direction. FIG. 17D is a vertical cross-sectional view of the first exemplary structure 10' of FIG. 17B taken along the Y-direction showing the adjacent formed vertical memory elements including PCM memory cells 135, 135A taken along the plane g-g' shown in FIG. 17B with each memory cell having a vertical, low electrical resistance drift liner on a single side (i.e., one-sided liner).

As described herein with respect to FIGS. 13A-17D, in one embodiment, the PCM cell is fabricated with minimal exposure of the phase change material to RIE chemistry using a fill-in process flow within the sacrificial masking layer of the etched access device. The wiring levels can be self-aligned to the access device and memory cell; the lower wiring level (e.g., wordline electrode) is patterned in conjunction with the patterning of the access device, and the upper wiring level (e.g., bitline electrode) is patterned together with the top electrode, Phase Change Memory and access device. Particularly, in the self-aligned approach depicted in FIGS. 3A-17D, there is an advantage in that only a single perpendicular etch process is performed, thus minimizing any potential damage to any PCM material cell having the single-sided liner.

As shown in FIG. 2A, 2B, multiple layers of this crosspoint memory array structure 10 can be combined to form a 3-Dimensional memory architecture. The method described in FIGS. 3A-17D mitigate a resistance drift of the amorphous region of the phase change material by including the Rs tuned liner in the PCM cell so that the read current path utilizes this liner and bypasses the amorphous region of the phase change material.

To avoid potential etch damage to the PCM memory cell due to the perpendicular cut resulting from etch processes described with respect to FIGS. 16A-16D, in connection with the first embodiment, processing steps according to a second embodiment may be employed for the stackable single layer crosspoint structure.

FIGS. 18A-26D describe a second process flow of the PCM array embodiment of the stackable single layer crosspoint structure that advantageously fabricates the memory arrays with a minimal number of masking steps and processing steps used for forming more reliable memory cells.

Figure 18C:
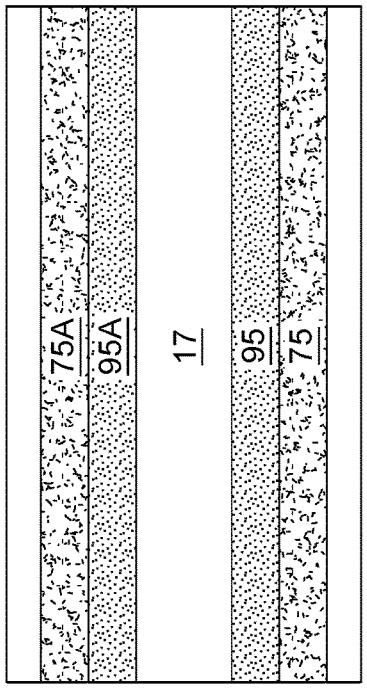
Figure 18D:
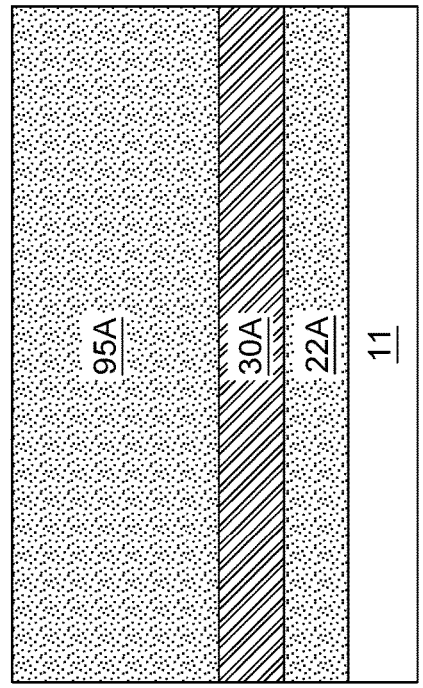
Figure 18A:
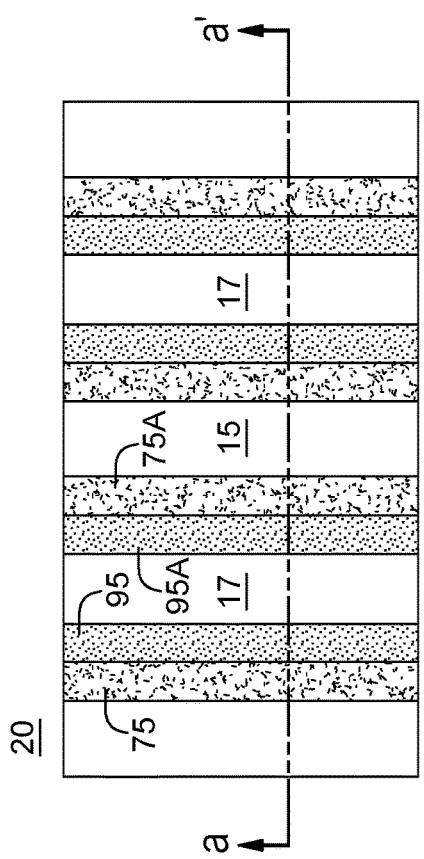

FIG. 18A shows a starting structure of a processing method in a second embodiment that is identical to the structure produced after performing encapsulation and planarization process steps of FIG. 11A in accordance with the first embodiment.

Figure 18B:
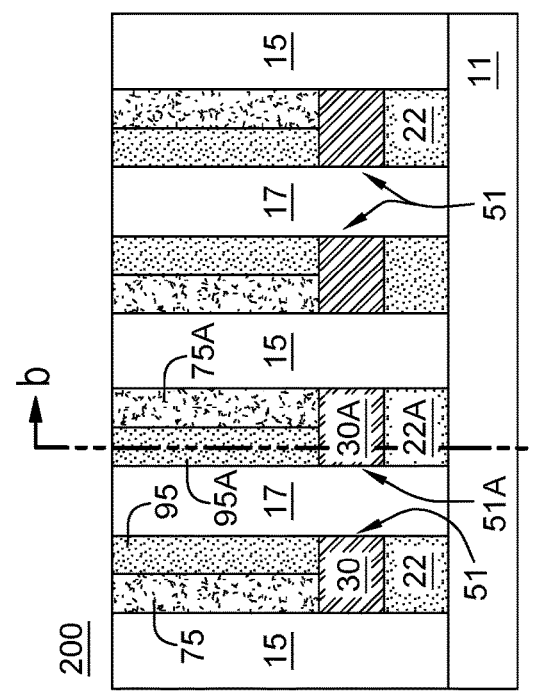

As shown in FIG. 18A, there is depicted a top view of the exemplary structure 200 produced in accordance with process steps depicted in FIGS. 3A-11A after performing an encapsulation that includes depositing a disposable dielectric fill material 17 between vertical stack structures 51, 51A along adjacent wordlines of FIG. 10B and subsequently planarizing the top surface employing the top surfaces of the sacrificial liner material as a stopping surface. The material of the disposable fill materials 15, 17 can include a semiconductor material, e.g., a dielectric material, such as amorphous carbon, silicon oxynitride, silicon nitride, a dielectric metal oxide, a dielectric metal nitride, an organic material, or any material that is different from the materials comprising the layers of the vertical stacks 51, 51A. FIG. 18B is a vertical cross-sectional view of the second exemplary structure 200 taken along the plane a-a' shown in FIG. 18A. In the view of FIG. 18B taken along the X-direction, encapsulating disposable dielectric fill material fills spaces between the vertical stacks 51, 51A of the aligned features including bottom interlevel electrode layer (wordline) 22, 22A, the formed access device layer 30, 30A and adjacent sub-lithographic vertically oriented portions of Rs tuning liner material 75, 75A and the adjacent single-sided sacrificial liner material layer 95, 95A. FIG. 18C is a top view of a portion of the first exemplary structure 200 of FIG. 18A taken lengthwise along a Y-axis direction. FIG. 18D is a vertical cross-sectional view of the second exemplary structure 200 of FIG. 18A along the Y-axis direction showing the deposited layers of the vertical stack 51, 51A taken along the plane b-b' shown in FIG. 18B. A planarization of the deposited disposable dielectric material is performed at the surface of structure 200 by a chemical mechanical planarization (CMP).

Figure 19C:
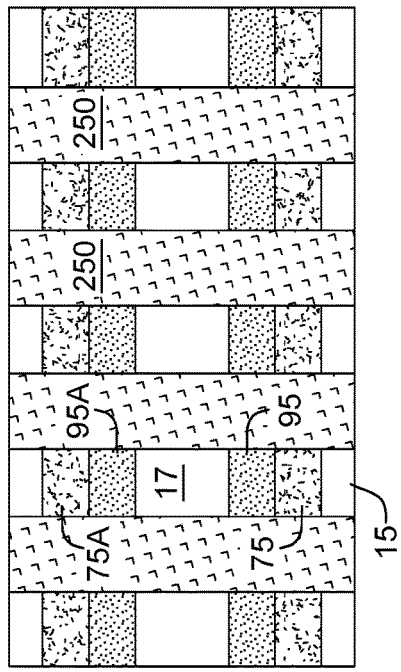
Figure 19D:
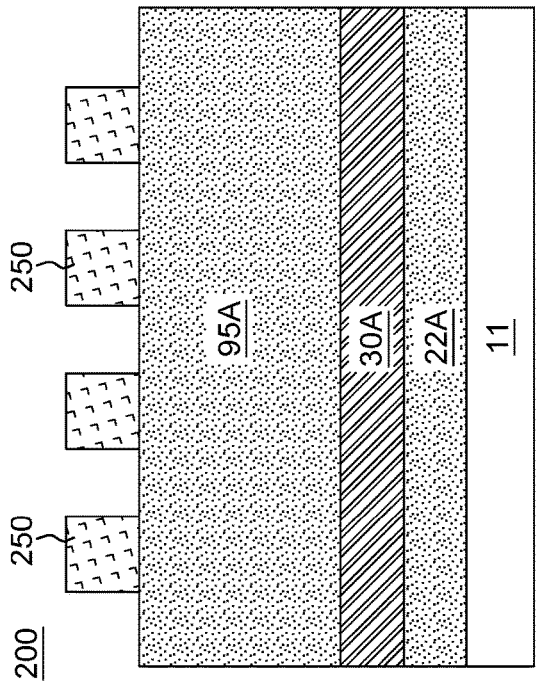
Figure 19A:
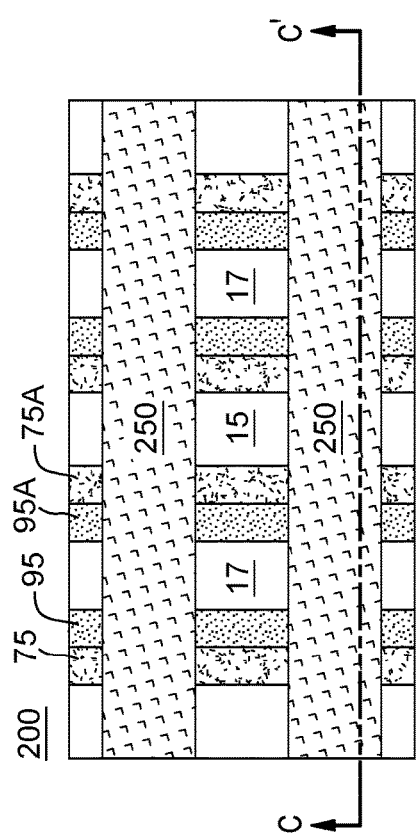
Figure 19B:
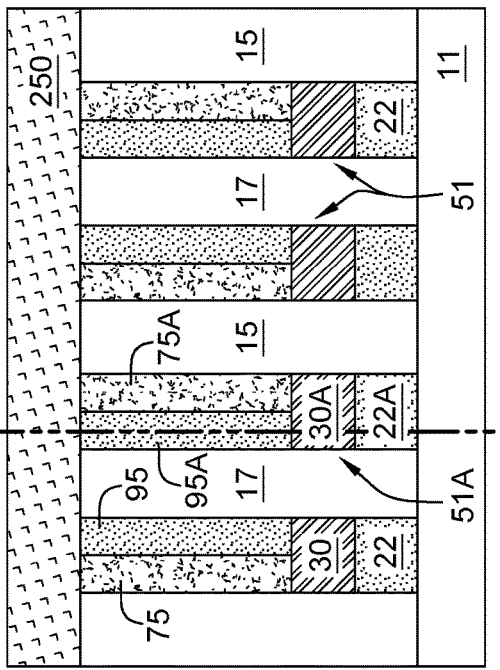

As shown in FIG. 19A, there is depicted a top view of the exemplary structure 200 taken along an X-axis direction of FIG. 18A after performing lithographic patterning of a mask layer (not shown) over the top surface and depositing a conductive metal to form a top sacrificial electrode pattern which pattern includes sacrificial material electrodes 250. FIG. 19B is a vertical cross-sectional view of the second exemplary structure 200 taken lengthwise along the plane c-c' shown in FIG. 19A. FIG. 19C is a top view of a portion of the second exemplary structure 200 of FIG. 19A taken along a Y-axis direction showing the patterned and formed sacrificial bitline electrodes 250. FIG. 19D is a vertical cross-sectional view of the second exemplary structure 200 of FIG. 19B along the Y-axis direction showing the deposited sacrificial bitline electrode layers 250 taken along the plane d-d' shown in FIG. 19B.

Figure 20A:
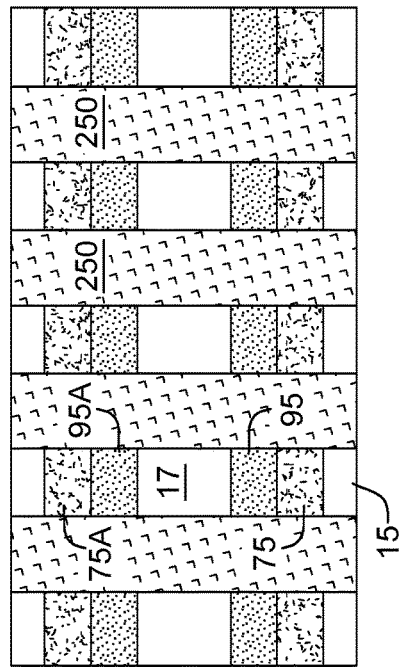
Figure 20B:
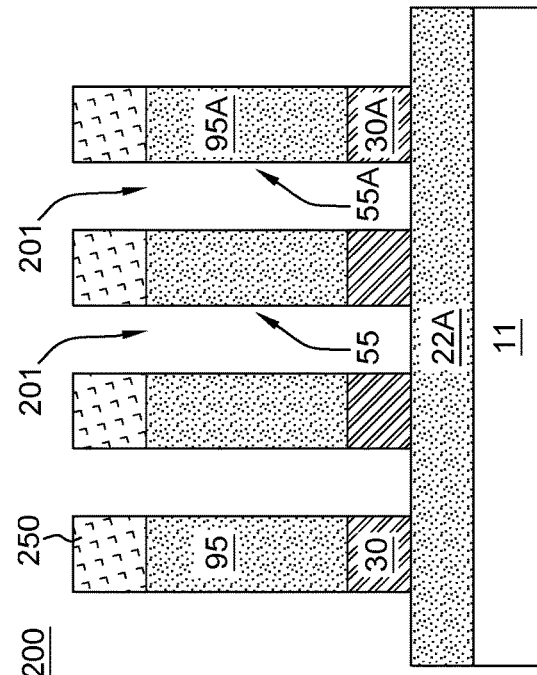
Figure 20C:
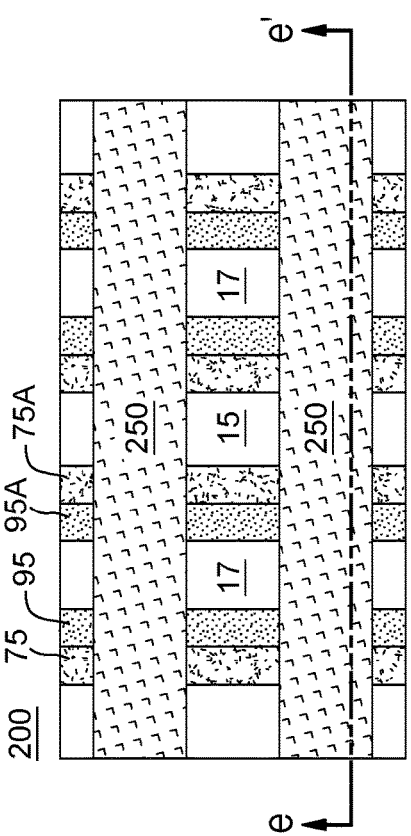
Figure 20D:
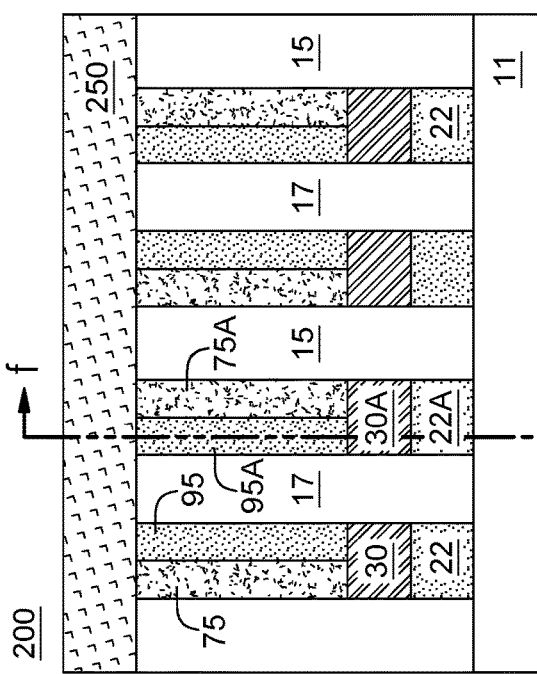

As shown in FIG. 20A, there is depicted a top view of the exemplary structure 200 of FIG. 19A taken along an X-axis direction after performing a perpendicular cut etch (i.e. in Y-axis direction) to remove all remaining disposable dielectric fill material between each of the formed sacrificial bitline electrodes 250. The perpendicular cut etch in effect removes disposable dielectric fill material between each of the formed sacrificial bitline electrodes 250 selective to the bitline and wordline conductors and selective to the access device and further selective to the vertically-oriented adjacent Rs tuning liner material layer 75 and the sacrificial liner material layer 95. FIG. 20B is a vertical cross-sectional view of the second exemplary structure 200 taken along the plane e-e' shown in FIG. 20A. In the view of FIG. 20B, plural vertical oriented stack structures including a corresponding access device connects a respective bottom wordline electrode 22, 22A to a perpendicular oriented corresponding top sacrificial bitline electrode structure 250 along the X-direction. FIG. 20C is a top view of a portion of the second exemplary structure 200 of FIG. 20A taken along a Y-axis direction showing the patterned and formed sacrificial bitline electrodes 250. FIG. 20D is a vertical cross-sectional view of the second exemplary structure 200 of FIG. 20B along the Y-axis direction showing the deposited sacrificial bitline electrode layers 250 connected to a corresponding formed vertical memory stack structure taken along the plane f-f' shown in FIG. 20B. In particular, as shown in FIG. 20D, the perpendicular cut etch removes disposable dielectric fill material between the patterned sacrificial bit line electrodes 250 along the Y-axis direction, leaving a respective plurality of vertical oriented stack structures or pillars 55, 55A. The perpendicular etching further opens up a high aspect ratio space 201 between each vertically oriented individual self-aligned memory pillars 55, 55A along a respective wordline 22, 22A. Each stack 55, 55A includes a respective access device 30, 30A and the overlying vertically-oriented adjacent sub-lithographic portions of single-sided Rs tuning liner material 75, 75A and the sacrificial liner material 95, 95A remain that have sidewalls self-aligned to the dimensions of a respective top sacrificial bitline electrode 250.

Figure 21A:
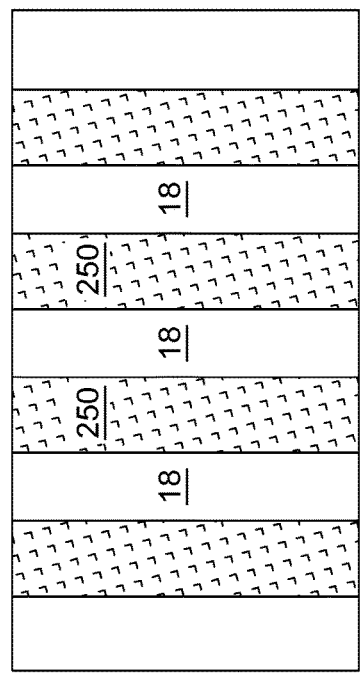
Figure 21D:
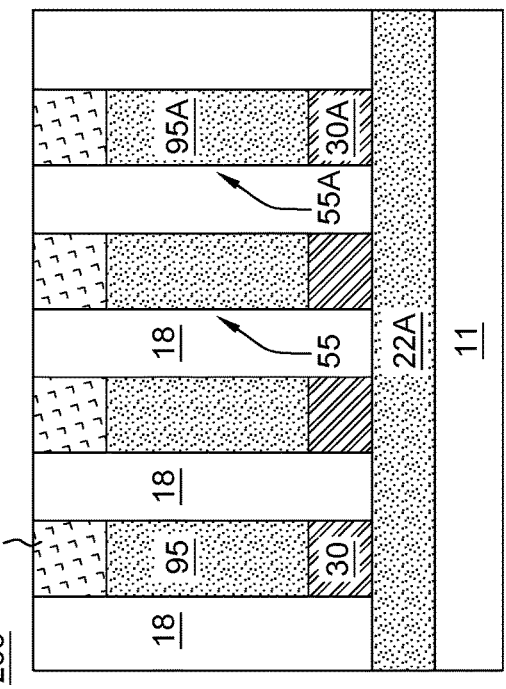
Figure 21C:
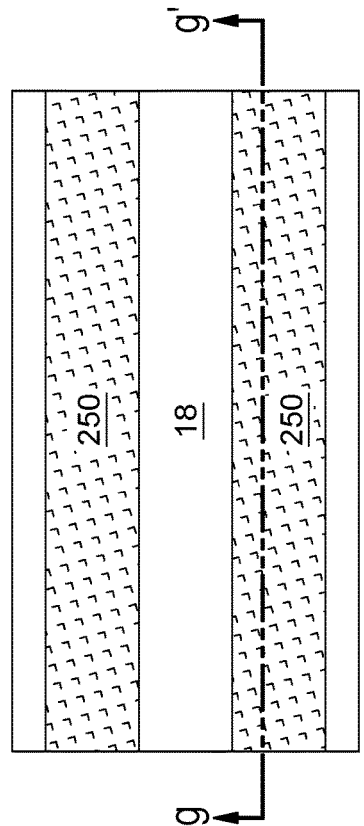
Figure 21B:
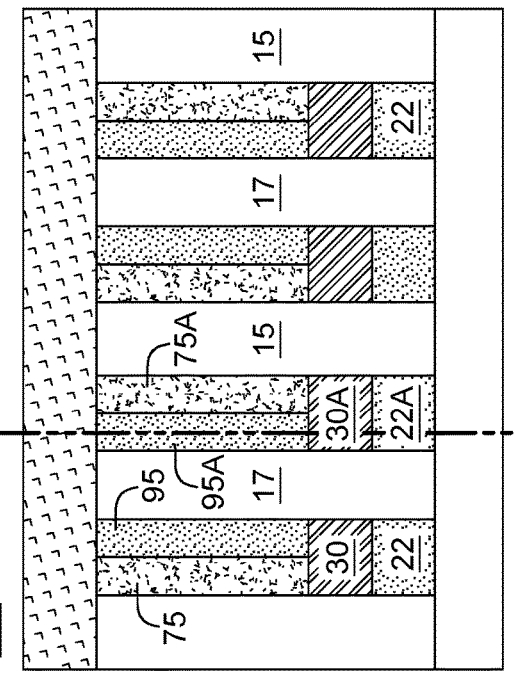

FIG. 21A depicts a top view of the exemplary structure 200 taken lengthwise along an X-direction of FIG. 20A after performing an encapsulation and planarization processes. The encapsulation includes depositing a dielectric fill material 18 in the remaining spaces 201 between memory pillar structures 55, 55A along a wordline conductor of FIG. 20D and using CMP to planarize a top surface of the structure to remove any excess deposited dielectric material and employing the top sacrificial bitline electrode as a stopping surface. The material of the disposable fill material layer 18 can include a semiconductor material, e.g., a dielectric material, such as amorphous carbon, silicon oxynitride, silicon nitride, a dielectric metal oxide, a dielectric metal nitride, an organic material, or any material that is different from the materials comprising the layers of the vertical stacks 55, 55A. FIG. 21B is a vertical cross-sectional view of the exemplary structure 200 taken along the plane g-g' shown in FIG. 21A. In the view of FIG. 21B taken along the X-direction, encapsulating disposable dielectric fill material 18 fills spaces between the vertical stacks 55, 55A of the aligned features including bottom interlevel electrode layer (wordline), the formed access device layer and adjacent sub-lithographic vertically oriented portions of Rs tuning liner material and the sacrificial liner material layer. FIG. 21C is a top view of a portion of the second exemplary structure 200 of FIG. 21A taken from a Y-axis perspective. FIG. 21D is a vertical cross-sectional view of the second exemplary structure 200 of FIG. 21A along the Y-direction showing the deposited layers of the vertical stack 55, 55A taken along the plane h-h' shown in FIG. 21B. The planarization of the deposited disposable dielectric material at the surface of the structure 200 can be performed by chemical mechanical planarization (CMP). The top surfaces of the planarization disposable dielectric material are rendered coplanar with the top surfaces of each adjacent sacrificial bitline electrode 250.

Figure 22A:
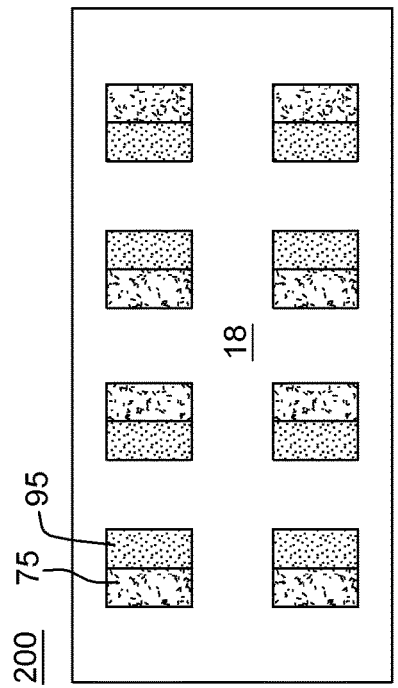
Figure 22C:
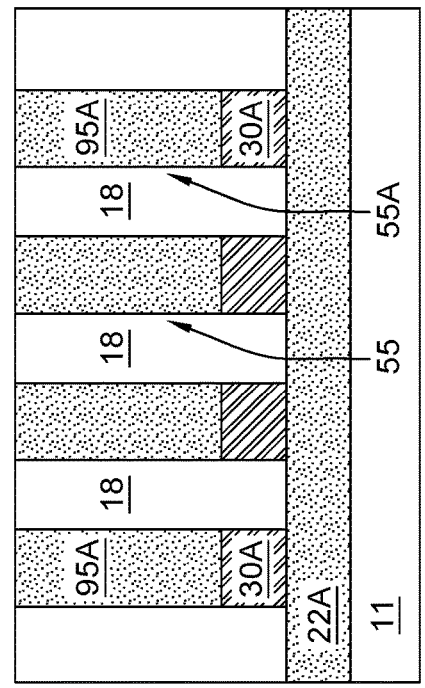
Figure 22B:
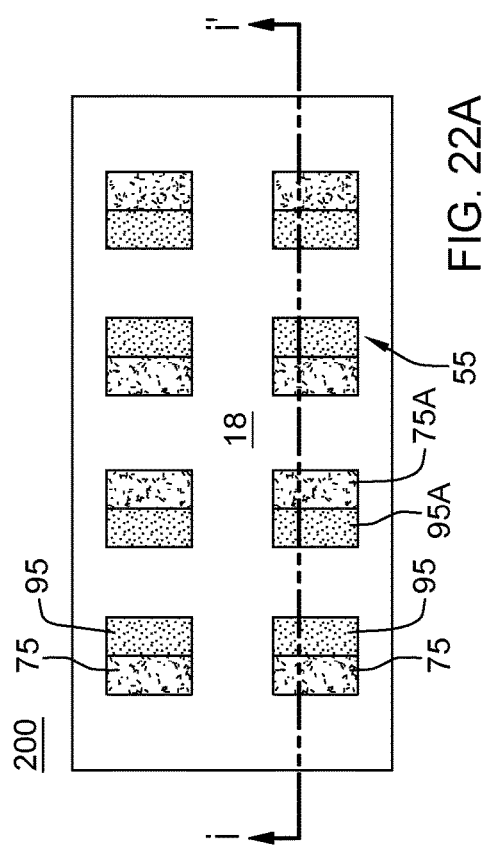
Figure 22D:
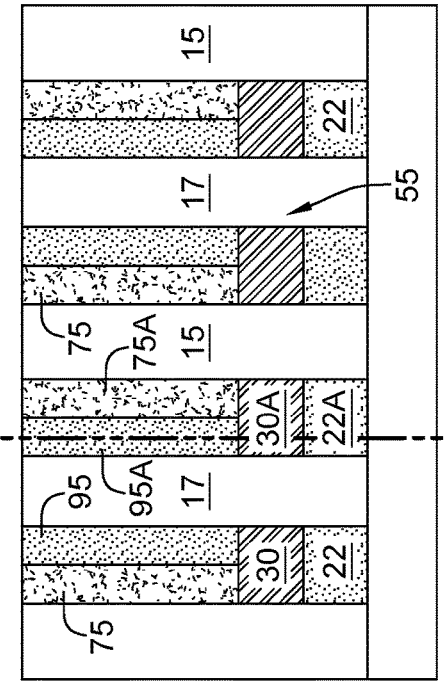

FIG. 22A depicts a top view of the exemplary structure 200 taken along an X-direction of FIG. 21A after performing a chemical-mechanical planarization (CMP) to remove the top sacrificial bitline electrodes and expose top surfaces of each sacrificial liner material layer 95, 95A at each respective vertical stack 55, 55A. FIG. 22B is a vertical cross-sectional view of the exemplary structure 200 taken along the plane i-i' shown in FIG. 22A. In the view of FIG. 22B taken along the X-direction, there is shown a top surface of the encapsulating disposable dielectric fill material 15, 17 that fills spaces between the vertical stacks coplanar with a top surface of the formed sub-lithographic vertically oriented Rs tuning liner material layer 75 and coplanar with a top surface of the sacrificial liner material layer 95. FIG. 22C is a top view of a portion of the second exemplary structure 200 of FIG. 22A taken lengthwise along a Y-axis direction. FIG. 22D is a vertical cross-sectional view of the second exemplary structure 200 of FIG. 22B along the Y-direction taken along the plane j-j' shown in FIG. 22B and showing the deposited layers of the vertical stack 55, 55A.

As shown in FIG. 23A, there is depicted a top view of the exemplary structure 200 taken along an X-direction of FIG. 22A after removing the sub-lithographic sacrificial liner material layer 95, 95A of each vertical stack portion 55 and 55A, e.g., using an anisotropic etch or an isotropic etch. FIG. 23B is a vertical cross-sectional view of the second exemplary structure 200 taken along the plane k-k' shown in FIG. 23A. In the view of FIG. 23B along the X-direction, the sacrificial liner layers 95, 95A are shown removed selective to the sub-lithographic single-sided Rs tuning liner material 75, 75A, disposable dielectric material 17 and access device layer 30, 30A. The resulting structure shows the formed sub-lithographic size high-aspect ratio openings 211 disposed about each alternating vertical oriented disposable dielectric material structure 17. The resulting structure shows the sub-lithographic size Rs tuning liner material layers 75 disposed on either side of remaining alternating adjacent vertical oriented disposable dielectric material structures 15. FIG. 23C is a top view of a portion of the second exemplary structure 200 of FIG. 23A taken along a Y-axis direction. FIG. 23D is a vertical cross-sectional view along the Y-direction of the exemplary structure of FIG. 23B particularly taken along line 1-1' shown in FIG. 23B to show the pattern of remaining vertical oriented dielectric structures 18 along the Y-axis direction along a conductive electrode (wordline) 22A and connected access device layer 30 with all sacrificial liner material 95 removed.

As shown in FIG. 24A, there is depicted a top view of the exemplary structure 200 taken along an X-direction of FIG. 23A after depositing a PCM memory device material, e.g., GST, on the structure of FIG. 23A. FIG. 24B is a vertical cross-sectional view of the exemplary structure 200 taken along the plane m-m' shown in FIG. 24A. In the view of FIG. 24B taken along the X-axis direction, the GST material 135 is shown deposited within and filling the sub-lithographic size openings 211 disposed about each alternating vertical oriented disposable dielectric material structure 17 and deposited on the top surface. FIG. 24C is a top view of a portion of the first exemplary structure 200 of FIG. 24A taken along a Y-axis direction. FIG. 24D is a vertical cross-sectional view of the first exemplary structure 200 of FIG. 24B along the Y-direction taken along the plane n-n' shown in FIG. 24B and showing the deposited layers 135, 135A of the resulting vertical stacks or memory element pillars 255, 255A along a wordline dimension (Y-axis).

Figure 25C:
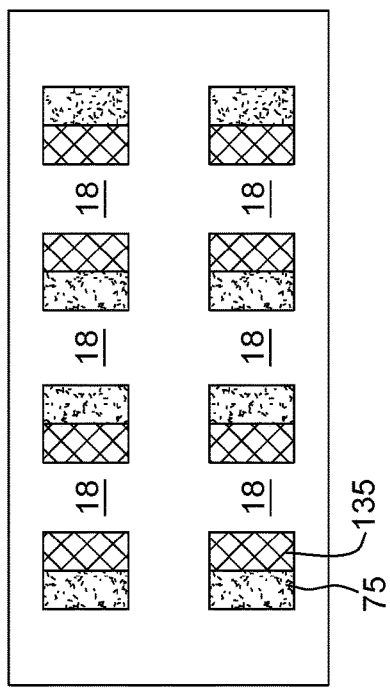
Figure 25D:
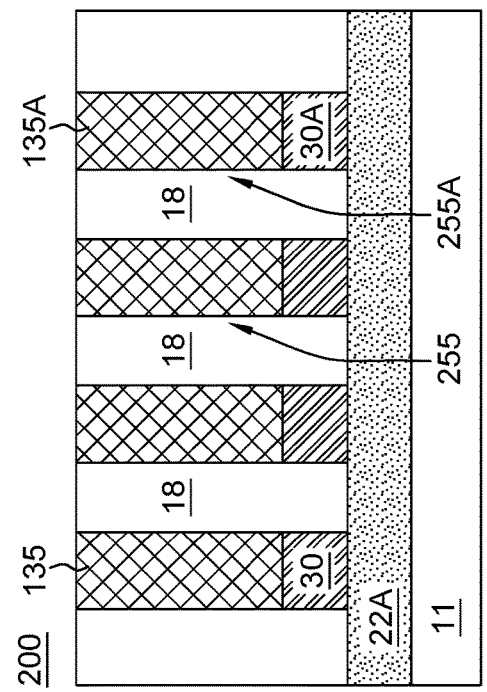
Figure 25A:
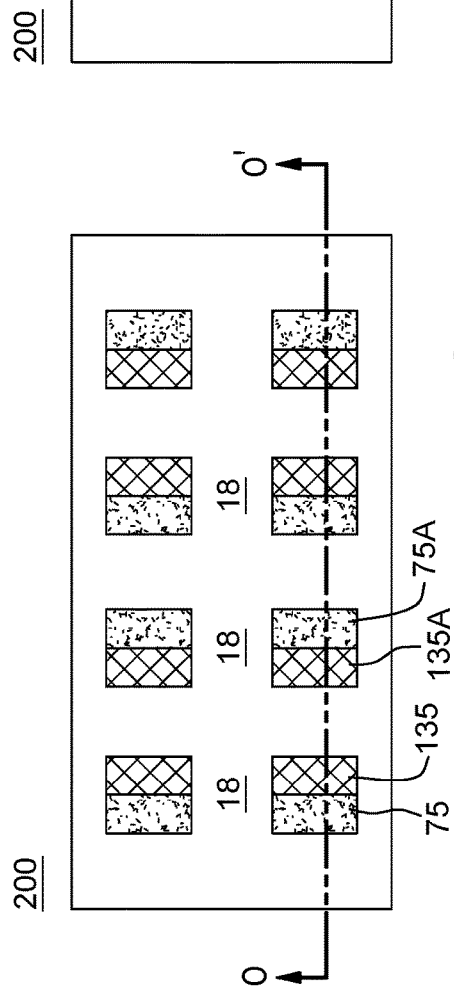
Figure 25B:
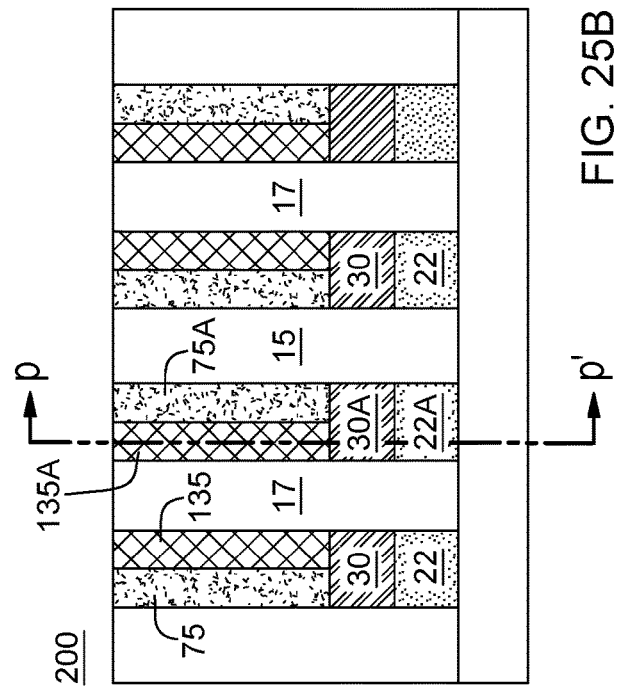

As shown in FIG. 25A, there is depicted a top view of the exemplary structure 200 taken along an X-direction of FIG. 24A after performing a GST planarization process to remove the GST from the field (i.e., from the surface of structure 200). The planarization can include a CMP technique to remove the GST layer formed on the top surface and planarize the top surface employing the top surfaces of the Rs tuning liner material 75 as a stopping surface such that the top surfaces can be coplanar. FIG. 25B is a vertical cross-sectional view of the first exemplary structure 200 taken along the plane o-o' shown in FIG. 25A. The view of FIG. 25B taken along the X-direction shows the planarized top surface without the GST layer. FIG. 25C is a top view of a portion of the second exemplary structure 200 of FIG. 25A taken lengthwise along a Y-axis direction. FIG. 25D is a vertical cross-sectional view of the first exemplary structure 200 of FIG. 25B along the Y-axis direction taken along the plane p-p' shown in FIG. 25B and showing the deposited layers of the vertical memory element pillars 255, 255A. As a result of the processing of FIG. 25A, the fully formed memory element pillars including the sub-lithographic dimensioned PCM (GST) material portion and the Rs tuning liner formed on one side thereof have exposed top surfaces in the manner as shown.

Figure 26A:
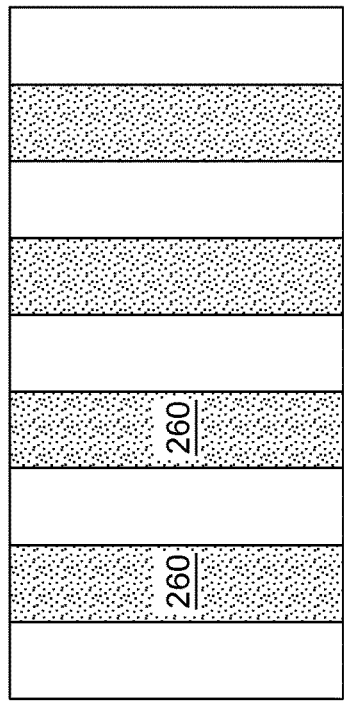
Figure 26B:
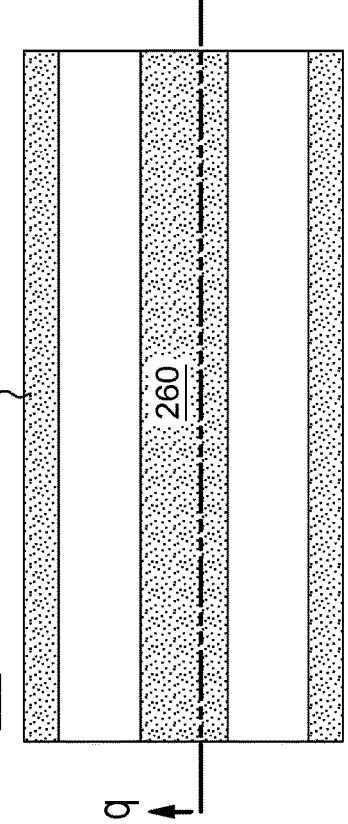
Figure 26C:
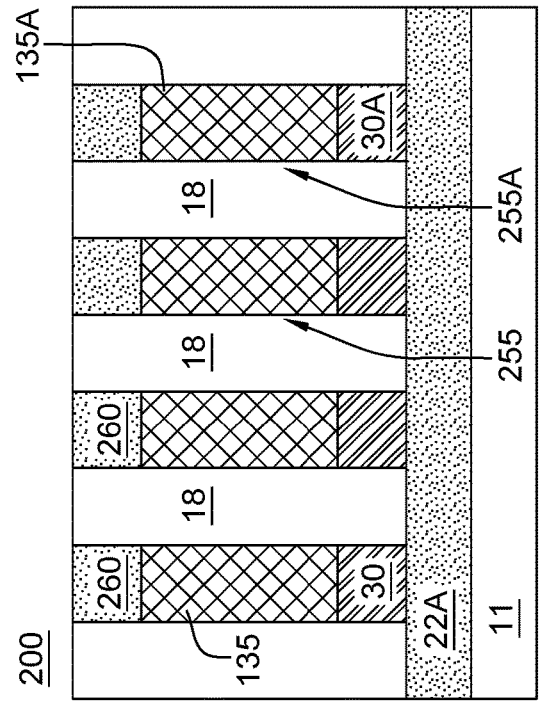
Figure 26D:
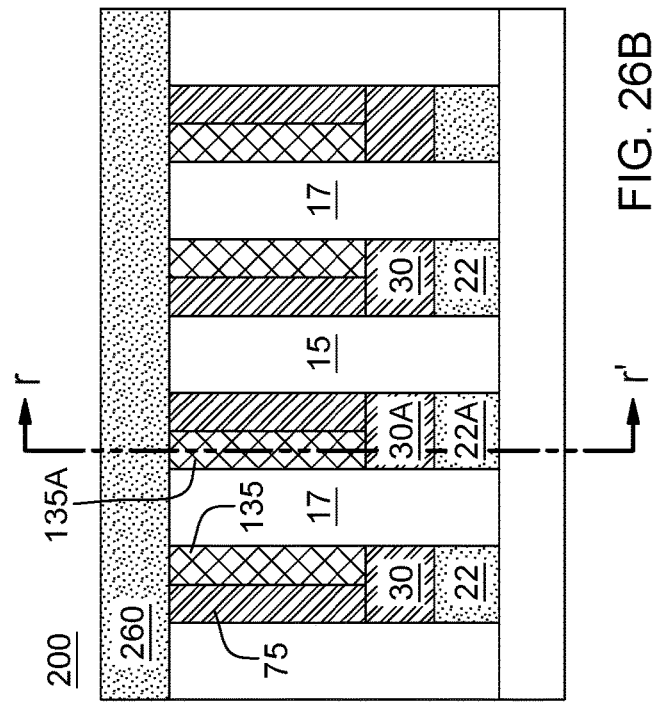

As shown in FIG. 26A, there is depicted a top view of the exemplary structure 200 taken along an X-axis direction of FIG. 25A after performing lithographic patterning of a mask layer (not shown) over the top surface and depositing a conductive metal to form a top electrode pattern which pattern includes conductive bitlines 260. As can be seen, this bit line patterning is not self-aligned, i.e., the bitlines are formed over the already formed memory element pillars 255, 255A along adjacent wordlines. FIG. 26B is a vertical cross-sectional view of the exemplary structure 200 taken along the plane q-q' shown in FIG. 26A. FIG. 26C is a top view of a portion of the first exemplary structure 200 of FIG. 26A taken along a Y-axis direction showing the patterned and formed bitline electrodes 260 that are not self-aligned to the underlying memory element 255, 255A. FIG. 26D is a vertical cross-sectional view of the first exemplary structure 200 of FIG. 26A along the Y-direction and taken along the plane r-r' shown in FIG. 26B showing the deposited bitline electrode conductor layers 260 on top formed memory element pillars 255, 255A. The structures of FIGS. 26B, 26D correspond to a formed stackable 2-D crosspoint PCM memory array.

As shown in FIGS. 27A, 27B, two stackable 2-D crosspoint PCM memory arrays 200A, 200B can be stacked to form a stackable 3-D crosspoint PCM memory array architecture 300 with each array 200A, 200B sharing a common conductor, e.g., bitline electrode 260.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A method of forming a memory array comprising:
forming a plurality of trench structures within a first dielectric layer, each trench of said plurality having a first conductive material layer on a bottom surface and an access device material layer formed on said first conductive material layer, a first layer of resistance-drift stabilizing liner material formed on inner sidewall surfaces in said trench, and a second sacrificial liner material formed on sidewalls adjacent to said first layer of turning liner material, each trench separated by adjacent first dielectric material structures;
patterning and etching an opening within each trench of said plurality, said etching selective to an underlying dielectric material below said first dielectric layer; and each opening defining a pattern comprising a plurality of structures, each structure defining a first conductive line structure, an access device layer above the first conductive material line structure and a liner structure disposed vertically above said access layer comprising adjacent layers of said resistance-drift stabilizing liner material and sacrificial liner material, the first conductive material line layer, the access layer, and vertically disposed liner structure in sidewall alignment;
depositing in the openings within each trench a dielectric material and planarizing a surface to render surfaces of the vertically disposed liner structure and the deposited dielectric material coplanar;
removing the adjacent sacrificial liner material from each vertically disposed liner structure in the pattern to provide an opening in the vertically disposed liner structure, said opening exposing a top surface of said access device layer; and
depositing a PCM material into the openings in each vertically disposed liner structure adjacent the resistance-drift stabilizing liner material to form a memory element having the resistance-drift stabilizing liner material disposed only on a single side of the PCM material, and planarizing a surface to render coplanar surfaces of the memory element and the deposited dielectric material;
patterning and forming a plurality of second conductive line structures on said surface in an orientation perpendicular relative to the first conductive material line structures; and
performing perpendicular cut etching to remove all dielectric material between the structures, said perpendicular cut etch rendering a 2-Dimensional cross point memory array having self-aligned first conductive line structures and second conductive line structures with respect to the memory elements, and
depositing a dielectric fill material in openings removed by said perpendicular cut etching and planarizing a surface to render top surfaces of the dielectric fill material and the first conductive material line structures coplanar.

2. The method of claim 1 wherein the forming of each plurality of trench structures comprises:
first depositing a first conductive material layer on a surface of a dielectric material layer;
depositing an access device material layer on the first conductive material layer;
depositing a sacrificial material layer on said access device material layer;
patterning and etching on a surface of said sacrificial material layer a plurality of openings, the etching selective to the dielectric material layer;
filling each opening with a dielectric material fill and planarizing to render a surface of the sacrificial material layer and a surface of the dielectric material fill coplanar; and
removing the said sacrificial material layer to form the trench.

3. The method of claim 2 further comprising:
depositing a resistance-drift stabilizing liner material layer on sidewall and bottom surfaces of each trench and etching to remove deposited resistance-drift stabilizing liner material from the trench bottom surface; and planarizing a surface of the first dielectric layer to render a surface of said resistance-drift stabilizing liner material layer and said dielectric material coplanar; and
depositing a sacrificial resistance-drift stabilizing liner material layer on exposed sidewall surfaces of said resistance-drift stabilizing liner material layer and bottom surfaces of each trench, and remove deposited sacrificial liner material from the trench bottom surface; and planarizing a surface of the first dielectric layer to render surfaces of said resistance-drift stabilizing liner material layer, said deposited sacrificial liner material and said dielectric material coplanar.

4. The method of claim 3, wherein said formed plurality of second conductive line structures are oriented in a direction perpendicular to the plurality of first conductive line structures, wherein an individual memory element of said plurality of elements is disposed at a respective intersection between a first conductive line structure and a second conductive line structure to form the crosspoint memory array, wherein both the PCM structure and the resistance-drift stabilizing liner of the memory element having one end contacting the second conductive line structure and a second end connected to one end of the access device, the access device having a second end contacting the first conductive line structure at the intersection.

5. The method of claim 3, wherein for memory elements disposed at intersections along the second conductive line structure, a first memory element and alternating first memory elements have an exposed resistance-drift stabilizing liner surface facing an exposed resistance-drift stabilizing liner surface of a respective adjacent second memory element on one side thereof.

6. The method of claim 3, wherein for memory elements disposed at intersections along the second conductive line structure, the first memory element and alternating first memory elements have an exposed surface of the PCM structure facing an exposed surface of the PCM structure of an adjacent said second memory element on another side thereof.

7. A method of forming a memory array comprising:
forming on a plurality of trench structures within a first dielectric layer, each trench of said plurality having a first conductive material layer on a bottom surface and an access device material layer formed on said first conductive material layer, a first layer of resistance-drift stabilizing liner material formed on inner sidewall surfaces in said trench, and a second sacrificial liner material formed on sidewalls adjacent to said first layer of turning liner material, each trench separated by adjacent first dielectric material structures;
patterning and etching an opening within each trench of said plurality, said etching selective to an underlying dielectric material below said first dielectric layer; and each opening defining a pattern comprising a plurality of structures, each structure defining a first conductive line structure, an access device layer above the first conductive material line structure and a liner structure disposed vertically above said access layer comprising adjacent layers of said resistance-drift stabilizing liner material and sacrificial liner material, the first conductive material line layer, the access layer, and vertically disposed liner structure in sidewall alignment;
depositing in the openings within each trench a dielectric material and planarizing a surface to render surfaces of the vertically disposed liner structure and the deposited dielectric material coplanar;
patterning a mask structure to form a pattern of sacrificial line structures on the planarized surface, the patterned sacrificial line structures oriented in a direction perpendicular to the plurality of first conductive line structures;
performing perpendicular cut etching to remove all dielectric material between the structures selective to the underlying first conductive material line structure;
depositing a dielectric fill material in openings removed by said perpendicular cut etching and planarizing a surface to render top surfaces of the dielectric fill material and the mask line structures coplanar;
performing CMP to expose a top surface of the vertically disposed adjacent layers of said resistance-drift stabilizing liner material and sacrificial liner material of each liner structure;
removing the adjacent sacrificial liner material from each vertically disposed liner structure in the pattern to provide an opening in the vertically disposed liner structure, said opening exposing a top surface of said access device layer; and
depositing a PCM material into the openings in each vertically disposed liner structure adjacent the resistance-drift stabilizing liner material to form a memory element having the resistance-drift stabilizing liner material disposed only on a single side of the PCM material, and planarizing a surface to render coplanar surfaces of the PCM material and the dielectric material;
patterning and forming a plurality of second conductive line structures on said surface in an orientation perpendicular relative to the first conductive material line structures, said second conductive line structures contacting exposed surfaces of said memory element of adjacent elements along the first conductive line structures, said patterning and forming of said second conductive line structures rendering a 2-Dimensional cross point memory array.

8. The method of claim 7 wherein the forming of each plurality of trench structures comprises:
first depositing a first conductive material layer on a surface of a dielectric material layer;
depositing an access device material layer on the first conductive material layer;
depositing a sacrificial material layer on said access device material layer;

patterning and etching on a surface of said sacrificial material layer a plurality of openings, the etching selective to the dielectric material layer;

filling each opening with a dielectric material fill and planarizing to render a surface of the sacrificial material layer and a surface of the dielectric material fill coplanar; and removing the said sacrificial material layer to form the trench.

9. The method of claim 8 further comprising:

depositing a resistance-drift stabilizing liner material layer on sidewall and bottom surfaces of each trench and etching to remove deposited resistance-drift stabilizing liner material from the trench bottom surface; and planarizing a surface of the first dielectric layer to render a surface of said resistance-drift stabilizing liner material layer and said dielectric material coplanar; and depositing a sacrificial resistance-drift stabilizing liner material layer on exposed sidewall surfaces of said resistance-drift stabilizing liner material layer and bottom surfaces of each trench, and remove deposited sacrificial liner material from the trench bottom surface; and planarizing a surface of the first dielectric layer to render surfaces of said resistance-drift stabilizing liner material layer, said deposited sacrificial liner material and said dielectric material coplanar.

10. The method of claim 8, wherein said formed plurality of second conductive line structures are oriented in a direction perpendicular to the plurality of first conductive line structures, wherein an individual memory element of said plurality of elements is disposed at a respective intersection between a first conductive line structure and a second conductive line structure to form the crosspoint memory array, wherein both the PCM structure and the resistance-drift stabilizing liner of the memory element having one end contacting the second conductive line structure and a second end connected to one end of the access device, the access device having a second end contacting the first conductive line structure at the intersection.

11. The method of claim 8, wherein for memory elements disposed at intersections along the second conductive line structure, a first memory element and alternating first memory elements have an exposed resistance-drift stabilizing liner surface facing an exposed resistance-drift stabilizing liner surface of a respective adjacent second memory element on one side thereof, and the first memory element and alternating first memory elements have an exposed surface of the PCM structure facing an exposed surface of the PCM structure of an adjacent said second memory element on another side thereof.

* * * * *